(12) United States Patent
Lee et al.

(10) Patent No.: US 11,088,038 B2
(45) Date of Patent: Aug. 10, 2021

(54) SEMICONDUCTOR PACKAGE INCLUDING TEST PAD

(71) Applicant: SAMSUNG ELECTRONICS CO., LTD., Suwon-si (KR)

(72) Inventors: Hyuek Jae Lee, Hwaseong-si (KR); Tae Hun Kim, Asan-si (KR); Ji Hwan Hwang, Hwaseong-si (KR); Ji Hoon Kim, Asan-si (KR); Ji Seok Hong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 7 days.

(21) Appl. No.: 16/508,498

(22) Filed: Jul. 11, 2019

(65) Prior Publication Data

US 2020/0135594 A1 Apr. 30, 2020

(30) Foreign Application Priority Data

Oct. 26, 2018 (KR) .................. 10-2018-0129137

(51) Int. Cl.
*H01L 23/528* (2006.01)
*H01L 21/66* (2006.01)
*H01L 23/00* (2006.01)

(52) U.S. Cl.
CPC .......... *H01L 22/32* (2013.01); *H01L 23/5283* (2013.01); *H01L 24/09* (2013.01)

(58) Field of Classification Search
None
See application file for complete search history.

(56) References Cited

U.S. PATENT DOCUMENTS

| 7,973,310 | B2 | 7/2011 | Wang et al. |
| 8,957,695 | B2 | 2/2015 | Takahashi et al. |
| 9,030,015 | B2 | 5/2015 | Huang et al. |
| 10,163,859 | B2 | 12/2018 | Yu et al. |
| 2008/0272372 | A1* | 11/2008 | Luo ..................... H01L 25/0657 257/48 |
| 2011/0241185 | A1* | 10/2011 | Koester ................. H01L 23/552 257/659 |

(Continued)

FOREIGN PATENT DOCUMENTS

| DE | 102016100011 A1 | 4/2017 |
| JP | 2008-182264 A | 8/2008 |

(Continued)

OTHER PUBLICATIONS

Communication dated Apr. 7, 2020, from the European Patent Office in counterpart European Application No. 19204360.2.

*Primary Examiner* — Benjamin P Sandvik
(74) *Attorney, Agent, or Firm* — Sughrue Mion, PLLC

(57) ABSTRACT

A semiconductor package includes a base including a first bonding structure; and a first semiconductor chip, including a second bonding structure, the second bonding structure being coupled to the first bonding structure of the base, wherein the first bonding structure includes: a test pad; a first pad being electrically connected to the test pad; and a first insulating layer, wherein the second bonding structure includes: a second pad being electrically connected to the first pad; and a second insulating layer being in contact with the first insulating layer, and wherein at least a portion of the test pad is in contact with the second insulating layer.

11 Claims, 19 Drawing Sheets

(56) References Cited

U.S. PATENT DOCUMENTS

| | | | |
|---|---|---|---|
| 2012/0097944 A1* | 4/2012 | Lin | H01L 22/34 |
| | | | 257/48 |
| 2012/0298410 A1* | 11/2012 | Lu | H01L 23/49827 |
| | | | 174/264 |
| 2013/0052760 A1* | 2/2013 | Cho | G01R 31/318513 |
| | | | 438/15 |
| 2013/0082260 A1 | 4/2013 | Nakamura | |
| 2013/0099235 A1 | 4/2013 | Han | |
| 2015/0279825 A1 | 10/2015 | Kang et al. | |
| 2016/0155724 A1 | 6/2016 | Kim et al. | |

FOREIGN PATENT DOCUMENTS

| | | |
|---|---|---|
| JP | 5399982 B2 | 1/2014 |
| KR | 10-2015-0112112 A | 10/2015 |
| KR | 10-2016-0066120 A | 6/2016 |

* cited by examiner

SEMICONDUCTOR PACKAGE INCLUDING TEST PAD

CROSS-REFERENCE TO RELATED APPLICATION

This application claims priority under 35 U.S.C. § 119 to Korean Patent Application No. 10-2018-0129137 filed on Oct. 26, 2018 in the Korean Intellectual Property Office, the disclosure of which is incorporated herein by reference in its entirety.

BACKGROUND

1. Field

Apparatuses consistent with example embodiments relate to a semiconductor package, and more particularly, to a semiconductor package including a test pad.

2. Description of Related Art

Recently, as demand for high performance electronic products as well as miniaturization of such high performance electronic products has been increasing, various types of semiconductor packages have been developed. To that end, semiconductor packages including a plurality of semiconductor chips are being developed where individual chips are mounted or stacked on a substrate or another chip to reduce the thickness of the semiconductor package.

While the individual chips are mounted or stacked, if a normal chip is mounted or stacked on a defective chip, not only the defective chip but also the normal chip stacked on the defective chip may not properly function in the semiconductor package.

SUMMARY

One of more example embodiments provide a semiconductor package including a test pad capable of inspecting defects of semiconductor chips.

According to an aspect of an example embodiment, there is provided a semiconductor package including a base including a first bonding structure; and a first semiconductor chip, including a second bonding structure, the second bonding structure being coupled to the first bonding structure of the base, wherein the first bonding structure includes: a test pad; a first pad being electrically connected to the test pad; and a first insulating layer, wherein the second bonding structure includes: a second pad being electrically connected to the first pad; and a second insulating layer being in contact with the first insulating layer, and wherein at least a portion of the test pad is in contact with the second insulating layer.

According to an aspect of another example embodiment, there is provided a semiconductor package including a base; and a plurality of semiconductor chips disposed on the base, wherein the plurality of semiconductor chips include: a first semiconductor chip; and a second semiconductor chip, which are sequentially stacked on and coupled to the base. The first semiconductor chip includes: a first surface; and a second surface opposite to the first surface. The second semiconductor chip includes: a third surface; and a fourth surface opposite to the third surface. The first semiconductor chip includes a first internal circuit wiring disposed on the first surface of the first semiconductor chip. The second semiconductor chip includes a second internal circuit wiring disposed on the third surface of the second semiconductor chip. The second surface of the first semiconductor chip includes: a first pad; a test pad; and a first insulating layer. The third surface of the second semiconductor chip includes: a second pad being in contact with and bonded to the first pad; and a second insulating layer being in contact with and bonded to the first insulating layer.

According to an aspect of another example embodiment, there is provided a semiconductor package including a base having a first surface and a second surface opposite to the first surface; a lower semiconductor chip disposed on the base and having a third surface and a fourth surface opposite to the third surface; and an upper semiconductor chip disposed on the lower semiconductor chip and having a fifth surface and a sixth surface opposite to the fifth surface. Each of the second surface of the base and the fourth surface of the lower semiconductor chip includes a first bonding structure. Each of the third surface of the lower semiconductor chip and the fifth surface of the upper semiconductor chip includes a second bonding structure. The first bonding structure includes: a first pad; a test pad; and a first insulating layer. The second bonding structure includes: a second pad; and a second insulating layer. The first bonding structure of the base and the second bonding structure of the lower semiconductor chip are bonded while being in contact with each other. The first bonding structure of the lower semiconductor chip and the second bonding structure of the upper semiconductor chip are bonded while being in contact with each other.

BRIEF DESCRIPTION OF DRAWINGS

The above and/or other aspects, features, and advantages of the disclosure will be more clearly understood from the following detailed description, taken in conjunction with the accompanying drawings, in which.

DETAILED DESCRIPTION

Hereinafter, example embodiments of the disclosure will be described with reference to the accompanying drawings.

Figure 1A:
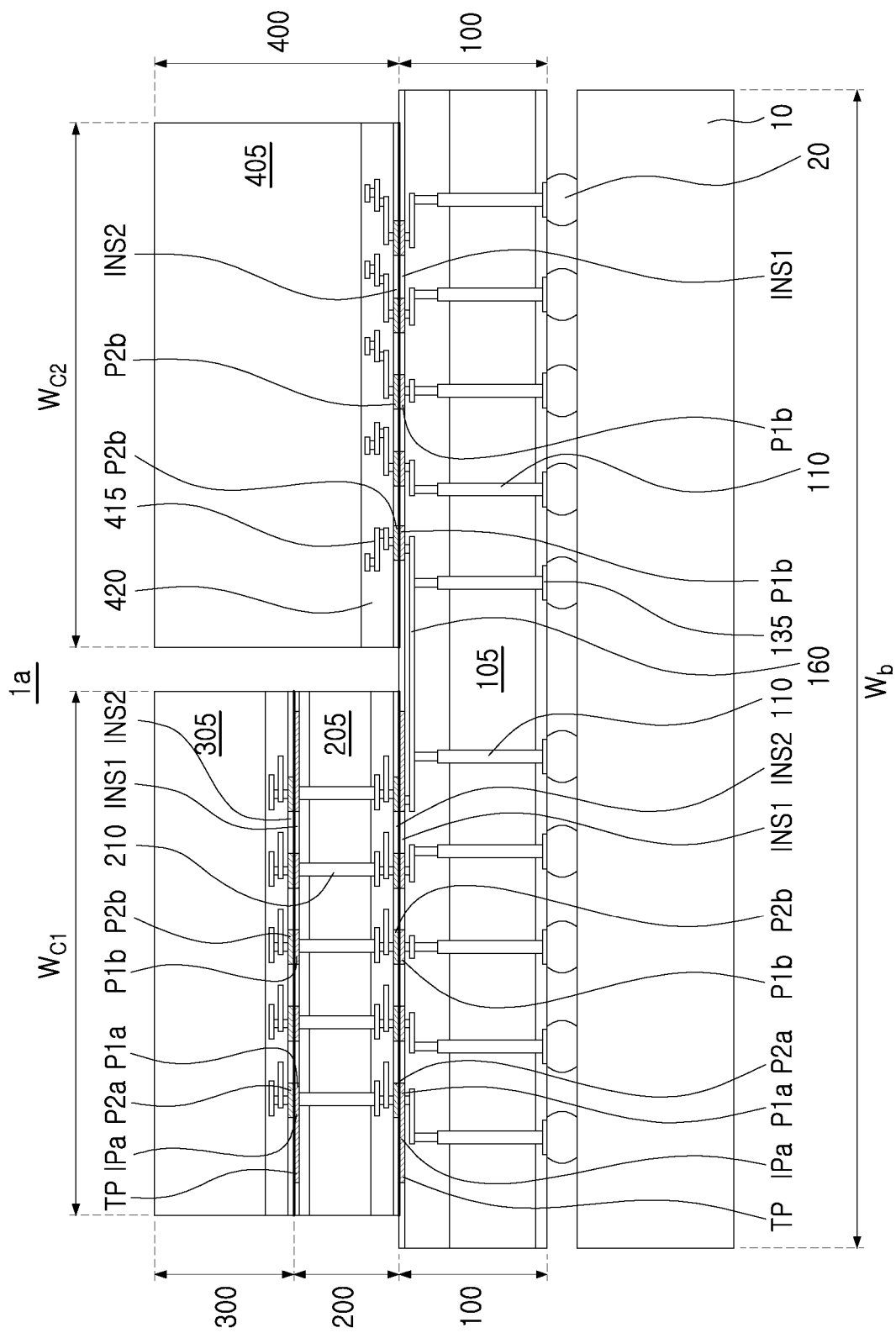
FIG. 1A is a cross-sectional view illustrating a semiconductor package according to an example embodiment.
Figure 1B:
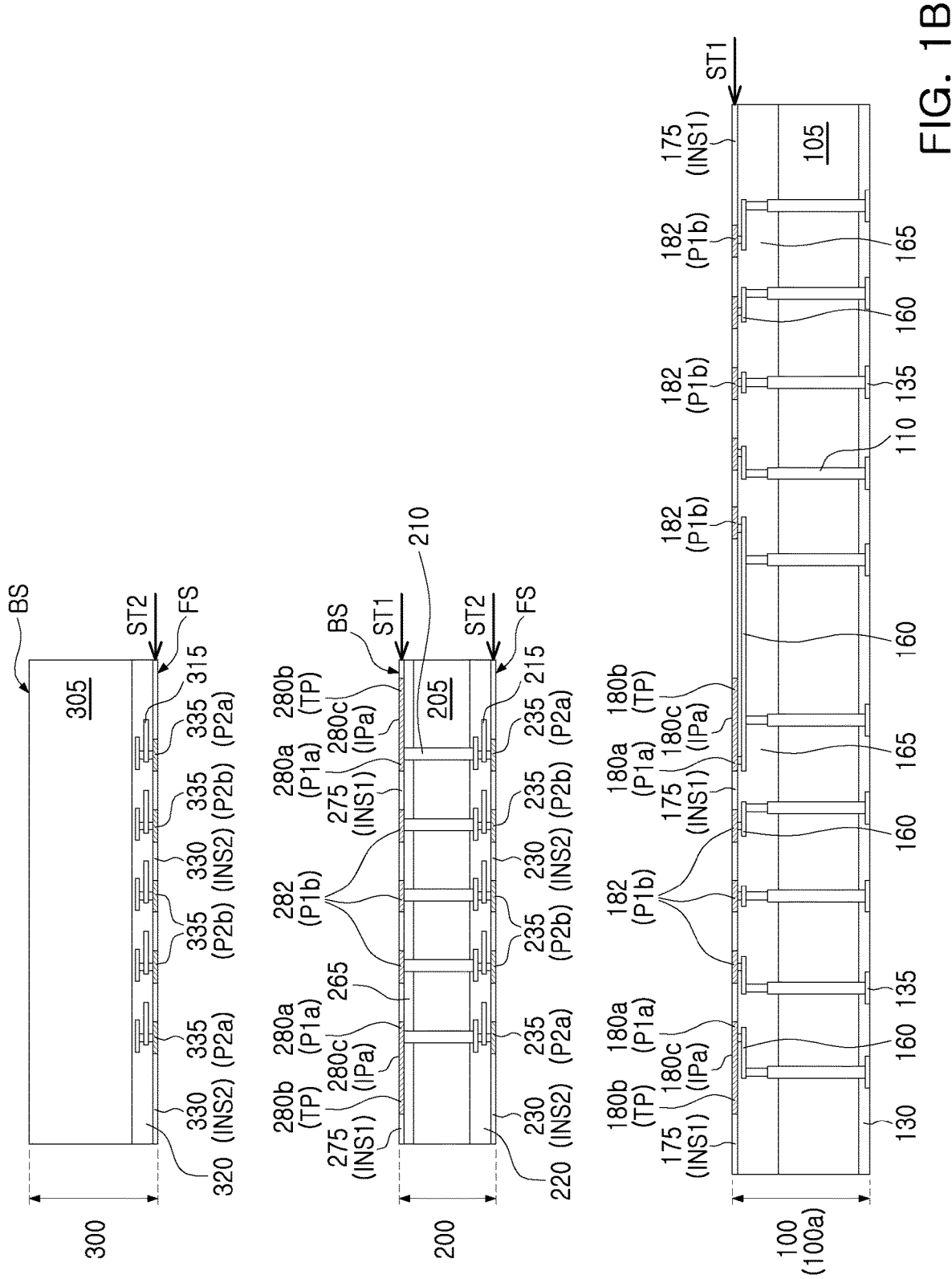
FIG. 1B is a cross-sectional view illustrating a base, a first semiconductor chip and a second semiconductor chip of the semiconductor package shown in FIG. 1A in an exploded manner according to an example embodiment.
Figure 2A:
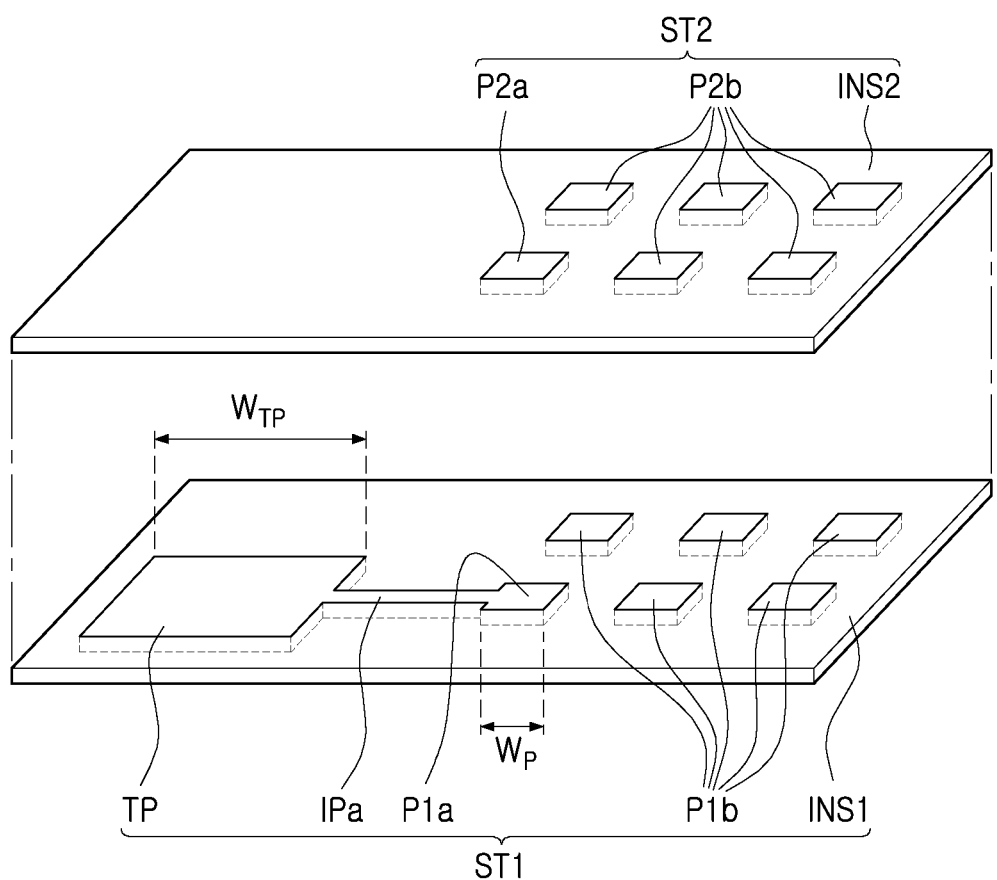
FIG. 2A is a perspective view illustrating a first bonding structure and a second bonding structure of the semiconductor chip of FIG. 1A in an exploded manner according to an example embodiment.

First, an example embodiment of a semiconductor package 1a according to an example embodiment will be described with reference to FIGS. 1A, 1B, and 2A. FIG. 1A is a cross-sectional view illustrating a semiconductor package according to an example embodiment. FIG. 1B is a cross-sectional view illustrating a base 100, a first semiconductor chip 200, and a second semiconductor chip 300 of the semiconductor chip 1a shown in FIG. 1A in an exploded manner according to an example embodiment. FIG. 2A is a perspective view illustrating a first bonding structure ST1 and a second bonding structure ST2 of FIGS. 1A and 1B in an exploded manner according to an example embodiment.

Referring to FIGS. 1A and 1B, a semiconductor package 1a according to an example embodiment may include a base 100 and one or more semiconductor chips on the base 100.

In an example embodiment, the base 100 may be an interposer. However, an example embodiment is not limited thereto. For example, the base 100 may be a semiconductor chip.

A semiconductor package 1a according to an example embodiment may further include a lower structure 10 disposed below the base 100 and coupled to the base 100 by a connection structure 20. The lower structure 10 may be a printed circuit board. The connection structure 20 may be a bump or a solder ball.

In an example embodiment, the semiconductor package 1a may include a first semiconductor chip 200 and a second semiconductor chip 300, which are sequentially stacked on the base 100, and a third semiconductor chip 400, which is disposed on the base 100 adjacent to the first semiconductor chip 200 as shown in FIG. 1A.

In an example embodiment, the first, second and third semiconductor chips 200, 300 and 400 may include a logic semiconductor chip and/or a memory semiconductor chip. For example, the first semiconductor chip 200 and the second semiconductor chip 300 may be a memory semiconductor chip, and the third semiconductor chip 400 may be a logic semiconductor chip. The memory semiconductor chip may be a volatile memory chip such as a dynamic random access memory (DRAM) or a static random access memory (SRAM), or a non-volatile memory chip such as a phase-change random access memory (PRAM), a magnetoresistive random access memory (MRAM), a ferroelectric random access memory (FeRAM), a resistive random access memory (RRAM) or a flash memory. The logic semiconductor chip may be a microprocessor, an analog device or a digital signal processor.

The base 100 and the first, second and third semiconductor chips 200, 300 and 400 may be coupled by incorporating a first bonding structure ST1 and a second bonding structures ST2. For example, the base 100 and the first semiconductor chip 200 may include a first bonding structure ST1 on the top surface of each of the base 100 and the first semiconductor chip 200, and the first semiconductor chip 200, the second semiconductor chip 300 and the third semiconductor chip 400 may include a second bonding structure ST2 on the bottom surface of each of the first semiconductor chip 200, the second semiconductor chip 300 and the third semiconductor chip 400. As shown in FIG. 1B, the first bonding structure ST1 of the base 100 is coupled to the second bonding structure ST2 of the first semiconductor chip 200 and the first bonding structure ST1 of the first semiconductor chip 200 is coupled to the second bonding structure ST2 of the second semiconductor chip 300. In addition, the base 100 has a width $W_b$ greater than a width $W_{c1}$, $W_{c2}$ of each of the first, second and third semiconductor chips.

The first bonding structure ST1 may include first pads P1a and P1b, test pads TP and a first insulating layer INS1. The second bonding structure ST2 may include second pads P2a and P2b and a second insulating layer INS2.

In an example embodiment, a first portion P1a of the first pads P1a and P1b may be electrically connected to the test pads TP by pad connection portions IPa, and a second portion P1b of first pads P1a and P1b may be spaced apart from the test pads TP as shown in FIG. 2A. In addition, each of the test pads TP has a width $W_{TP}$ greater than a width $W_p$ of each of the first pads P1a and P1b.

The first pads P1a and P1b and the second pads P2a and P2b may be in direct contact with each other as the first bonding structure ST1 and the second bonding structure ST2 are coupled to each other. The first pads P1a and P1b and the second pads P2a and P2b may include the same conductive material, for example, copper (Cu). The first pads P1a and P1b and the second pads P2a and P2b which are in direct contact with each other, while facing each other may be coupled by mutual diffusion of copper.

In an example embodiment, the conductive material capable of forming the first pads P1a and P1b and the second pads P2a and P2b may be not limited to copper, but may include any material capable of being mutually coupled to each other. For example, the conductive material capable of forming the first pads P1a and P1b and the second pads P2a and P2b may include gold (Au).

The first insulating layer INS1 of the first bonding structure ST1 and the second insulating layer INS2 of the second bonding structure ST2 may be in direct contact with each other while facing each other as the first bonding structure ST1 and the second bonding structure ST2 are coupled to each other. The first insulating layer INS1 and the second insulating layer INS2 may be formed of the same material. For example, the first insulating layer INS1 and the second insulating layer INS2 may be formed of silicon oxide ($SiO_2$). The first insulating layer INS1 and the second insulating layer INS2 may be coupled to each other while being in direct contact with each other.

In an example embodiment, the first insulating layer INS1 and the second insulating layer INS2 may be not limited to silicon oxide ($SiO_2$), and may include all materials capable of being mutually coupled to each other. For example, the first insulating layer INS1 and the second insulating layer INS2 may be formed of silicon carbon nitride (SiCN).

Referring back to FIGS. 1 and 1B, the base 100 may include a base body 105, a lower insulating layer 130 and a base lower pad 135 disposed below the base body 105, base back side structures 165 and 160 disposed on the base body 105, a first bonding structure ST1 disposed on the base back side structures 160 and 165, and base through electrode structures 110 penetrating through the base body 105. The base body 105 may be a semiconductor substrate. For example, the base body 105 may be a silicon substrate.

The first bonding structure ST1 of the base 100 may include first pads 180a (P1a) and 182 (P1b), pad connection portions 180c (IP), test pads 180c (TP), and a first insulating layer 175 (INS1).

The base back side structures 160 and 165 may include a base back side insulating layer 165 and a base wiring structure 160 disposed in the base back side insulating layer 165 and electrically connecting the base through electrode structures 110 and the first pads 180a (P1a) and 182 (P1b) of the base 100. The base through electrode structures 110 may be electrically connected to the base lower pads 135. Accordingly, the first pads 180a (P1a) and 182 (P1b) of the base 100 may be electrically connected to the base lower pads 135 through the base through electrode structures 110. The base through electrode structures 110 may be a through-silicon via (TSV) structure. The base wiring structure 160 may be electrically connected to test pads 180c (TP). For example, the base wiring structure 160 may be electrically connected to the test pads 180c (TP) through the first pads P1b and the connection portions IPa.

The first semiconductor chip 200 may include a first semiconductor body 205, an upper insulating layer 265 disposed on the first semiconductor body 205, the first bonding structure ST1 disposed on the upper insulating layer 265, first internal circuit structures 215 and 220 disposed below the first semiconductor body 205, the second bonding structure ST2 disposed below the first internal circuit structures 215 and 220, and a first through electrode structure 210 penetrating through the first semiconductor body 205. The first through electrode structure 210 may be a through-silicon via (TSV) structure. The first semiconductor body 205 may be a semiconductor substrate, for example, a silicon substrate.

The first bonding structure ST1 of the first semiconductor chip 200 may include first pads 280a (P1a) and 282 (P1b), pad connection portions 280c (IP), test pads 280c (TP) and a first insulating layer 275 (INS1). The first pads 280a (P1a) and 282 (P1b) of the first semiconductor chip 200 may be electrically connected to the first through electrode structures 210. The second bonding structure ST2 of the first semiconductor chip 200 may include second pads 235 (P2a and P2b) and a second insulating layer 230 (INS2).

The first internal circuit structures 215 and 220 of the first semiconductor chip 200 may include first internal circuit wirings 215 disposed in the first lower insulating layer 220 and electrically connected to the first through electrode structures 210 and the first pads 280a (P1a) and 282 (P1b) of the first semiconductor chip 200. The first internal circuit structures 215 and 220 may be disposed between the second boding structure ST2 of the first semiconductor chip 200 and the first semiconductor body 205.

The second semiconductor chip 300 may include a second semiconductor body 305, second internal circuit structures 315 and 320 disposed below the second semiconductor body 305 and the second bonding structure ST2 disposed below the second internal circuit structures 315 and 320. The second semiconductor body 305 may be a semiconductor substrate, for example, a silicon substrate. The second bonding structure ST2 of the second semiconductor chip 300 may include second pads 335 (P2a and P2b) and a second insulating layer 330 (INS2).

The second internal circuit structures 315 and 320 of the second semiconductor chip 300 may include a second lower insulating layer 320 and second internal circuit wirings 315 disposed in the second lower insulating layer 320 and electrically connected to the second pads 335 (P2a and P2b) of the second semiconductor chip 300. The second internal circuit structures 315 and 320 may be disposed between the second boding structure ST2 of the second semiconductor chip 300 and the second semiconductor body 305.

The third semiconductor chip 400 may include a third semiconductor body 405, third internal circuit structures 415 and 420 disposed below the third semiconductor body 405, second pads P2b disposed below the third internal circuit structures 415 and 420 and constituting the second bonding structures ST2 as described above and the second insulating layer INS2. The third internal circuit structures 415 and 420 may include a lower insulating layer 420 and third internal circuit wirings 415 in the lower insulating layer 420. The third internal circuit structures 415 and 420 may be disposed between the second boding structure ST2 of the third semiconductor chip 400 and the second semiconductor body 405.

The base 100 and the first semiconductor chip 200 may be coupled by bonding the first bonding structure ST1 of the base 100 and the second bonding structure ST2 of the first semiconductor chip 200. For example, the first pads 180a (P1a) and 182 (P1b) of the base 100 and the second pads 235 (P2a and P2b) of the first semiconductor chip 200 may be bonded and coupled while being in contact with each other, and the first insulating layer 175 (INS1) of the base 100 and the second insulating layer 230 (INS2) of the first semiconductor chip 200 may be bonded and coupled while being in contact with each other.

The base 100 and the third semiconductor chip 400 may be bonded and coupled while the first pads 182 (P1b) of the base 100 and the second pads P2b of the third semiconductor chip 400 are in contact with each other, and may be bonded and coupled while the first insulating layer 175 (INS1) of the base 100 and the second insulating layer INS2 of the third semiconductor chip 400 are in contact with each other.

The first semiconductor chip 200 and the second semiconductor chip 300 may be coupled while the first bonding structure ST1 of the first semiconductor chip 200 and the second bonding structure ST2 of the second semiconductor chip 300 are bonded. For example, the first pads 280a (P1a) and 282 (P1b) of the first semiconductor chip 200 and the second pads 335 (P2a and P2b of the second semiconductor chip 300 may be bonded and coupled while being in contact with each other, and the first insulating layer 275 (INS1) of the first semiconductor chip 200 and the second insulating layer 330 (INS2) of the second semiconductor chip 300 may be bonded and coupled while being in contact with each other.

Each of the first and second semiconductor chips 200 and 300 may have a front side FS and a back side BS, opposing each other. The front side FS of the first semiconductor chip 200 may be in contact with and bonded to the base 100, and the back side BS of the first semiconductor chip 200 may be in contact with and bonded to the front side FS of the second semiconductor chip 300.

In some embodiments, the front side FS of the first semiconductor chip 200 may be referred to as a first surface, the back side BS of the first semiconductor chip 200 may be referred to as a second surface, the front side FS of the second semiconductor chip 300 may be referred to as a third surface, and the back side BS of the second semiconductor chip 300 may be referred to as a fourth surface.

In some embodiments, the base 100a may include a first surface and a second surface opposite to the first surface, the front side FS of the first semiconductor chip 200 may be referred to as a third surface, the back side BS of the first semiconductor chip 200 may be referred to as a fourth surface, the front side FS of the second semiconductor chip 300 may be referred to as a fifth surface, and the back side BS of the second semiconductor chip 300 may be referred to as a sixth surface.

In some embodiments, the first bonding structure ST1 of the first semiconductor chip 200 may be referred to as a third bonding structure, the second bonding structure ST2 of the second semiconductor chip 200 may be referred to as a fourth bonding structure.

Each of the first pads P1a and P1b may be smaller than each of the test pads TP.

In an example embodiment, when seen in plan view, each of the first and second pads P1a, P1b, P2a and P2b may have a polygonal shape. For example, when seen in plan view, each of the first and second pads P1a, P1b, P2a and P2b may have a rectangular shape.

Figure 2B:
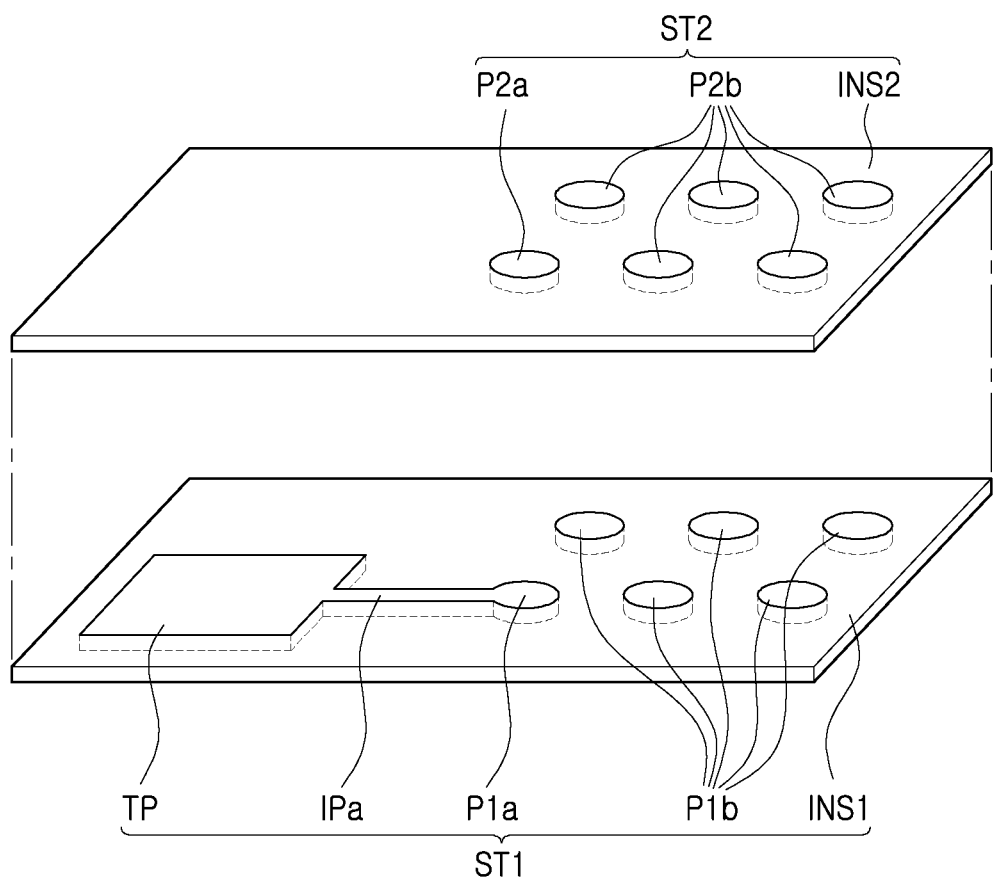
FIG. 2B is a perspective view illustrating a modified example of a first bonding structure and a second bonding structure of the semiconductor chip of FIG. 1A according to an example embodiment.

In a modified example, referring to FIG. 2B, when seen in plan view, each of the first and second pads P1a, P1b, P2a and P2b may have a circular shape.

Figure 3:
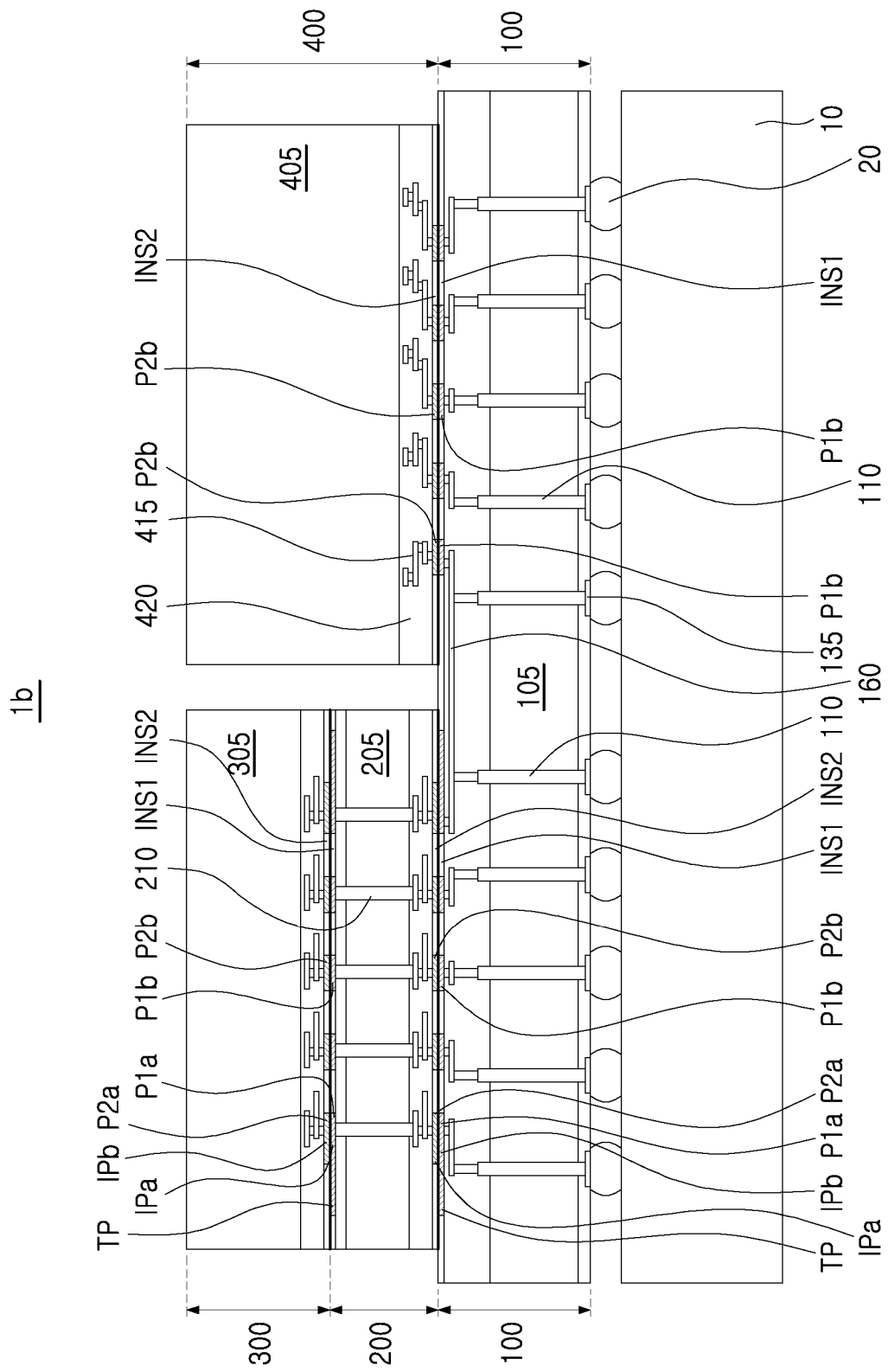
FIG. 3 is a cross-sectional view illustrating a modified example of a semiconductor package according to an example embodiment.
Figure 4:
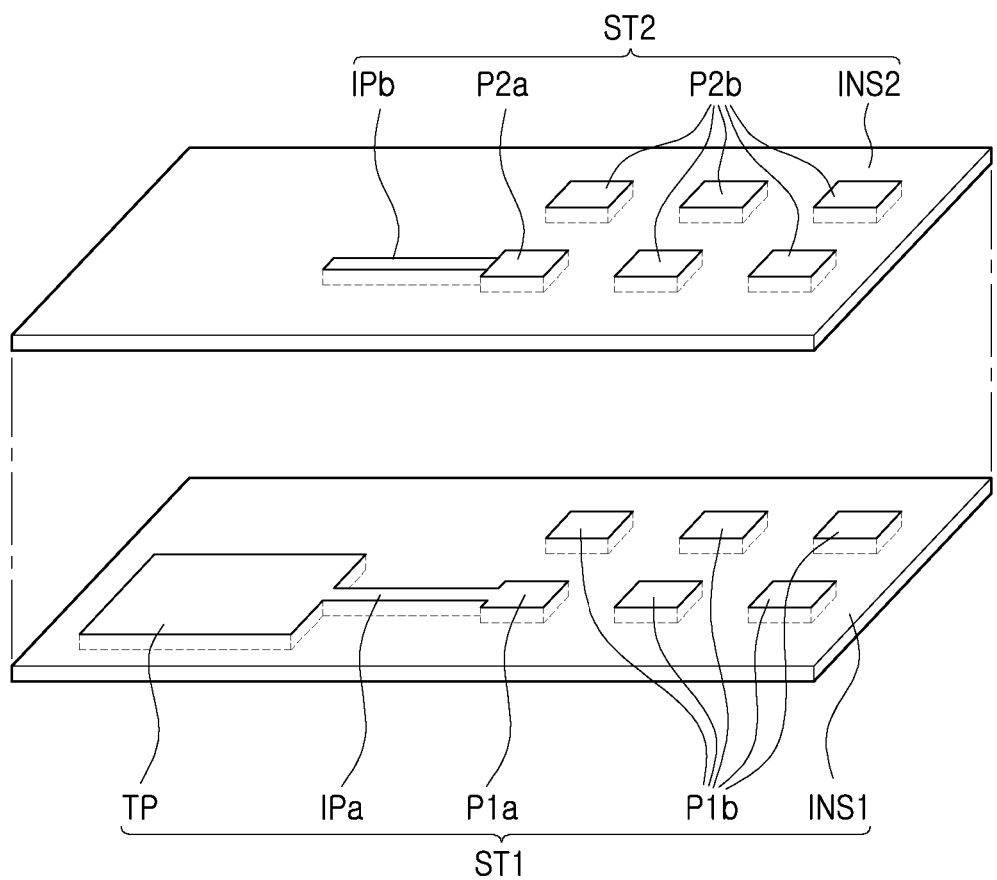
FIG. 4 is a cross-sectional view illustrating a first bonding structure and a second bonding structure of the semiconductor chip of FIG. 3 in an exploded manner according to an example embodiment.
Figure 5:
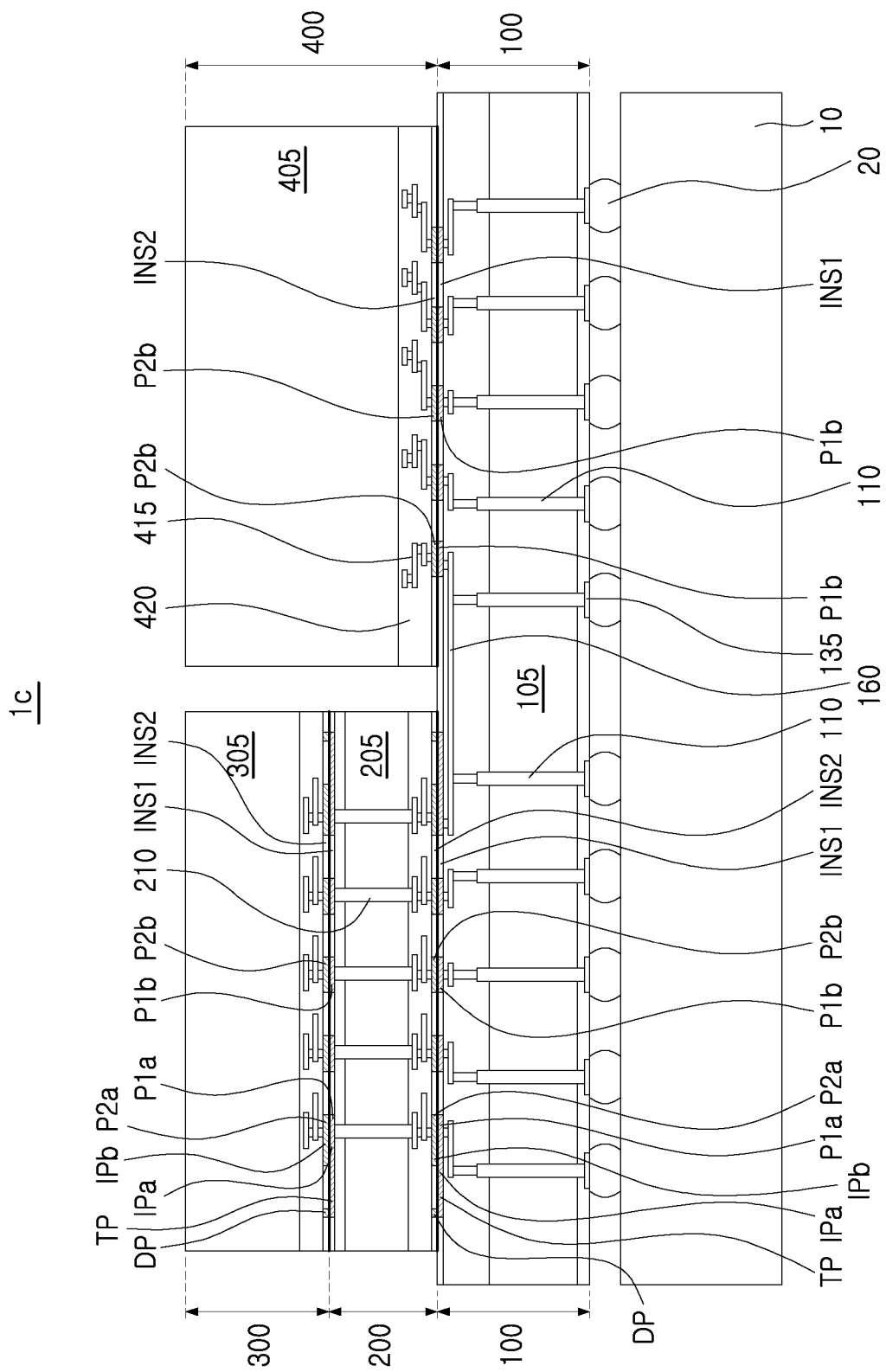
FIG. 5 is a cross-sectional view illustrating a modified example of a semiconductor package according to an example embodiment.
Figure 6:
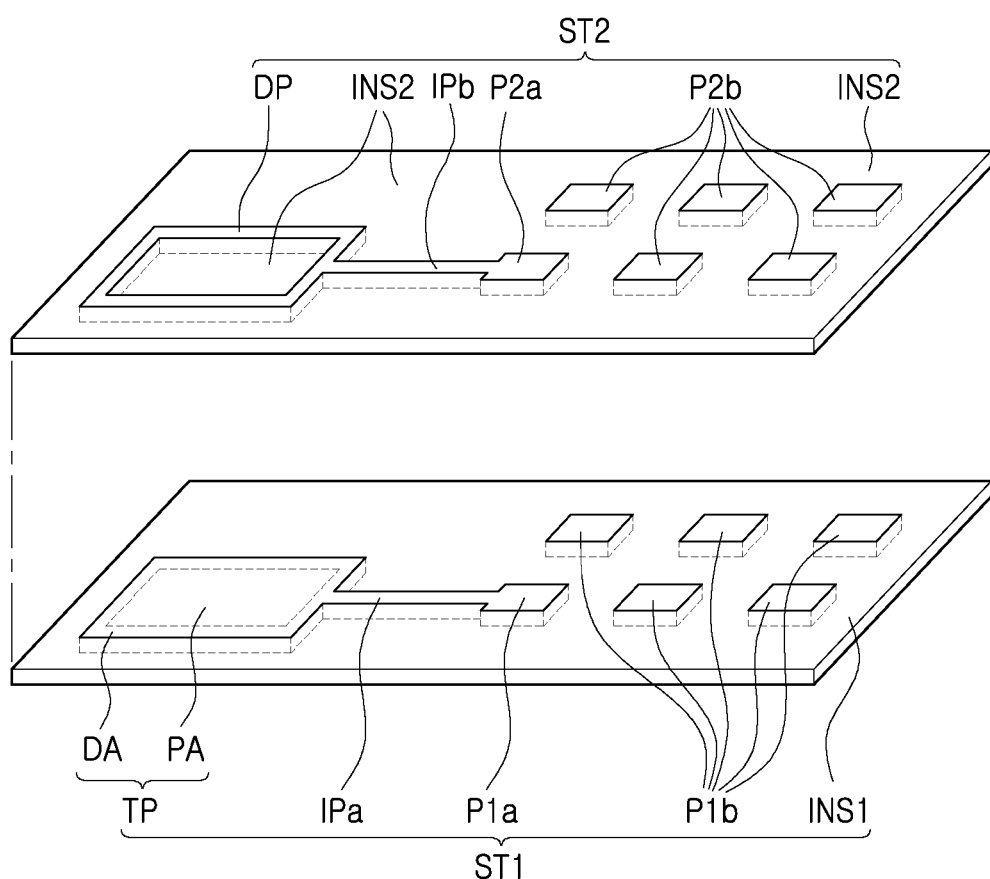
FIG. 6 is a cross-sectional view illustrating a first bonding structure and a second bonding structure of the semiconductor chip of FIG. 5 in an exploded manner according to an example embodiment.
Figure 7:
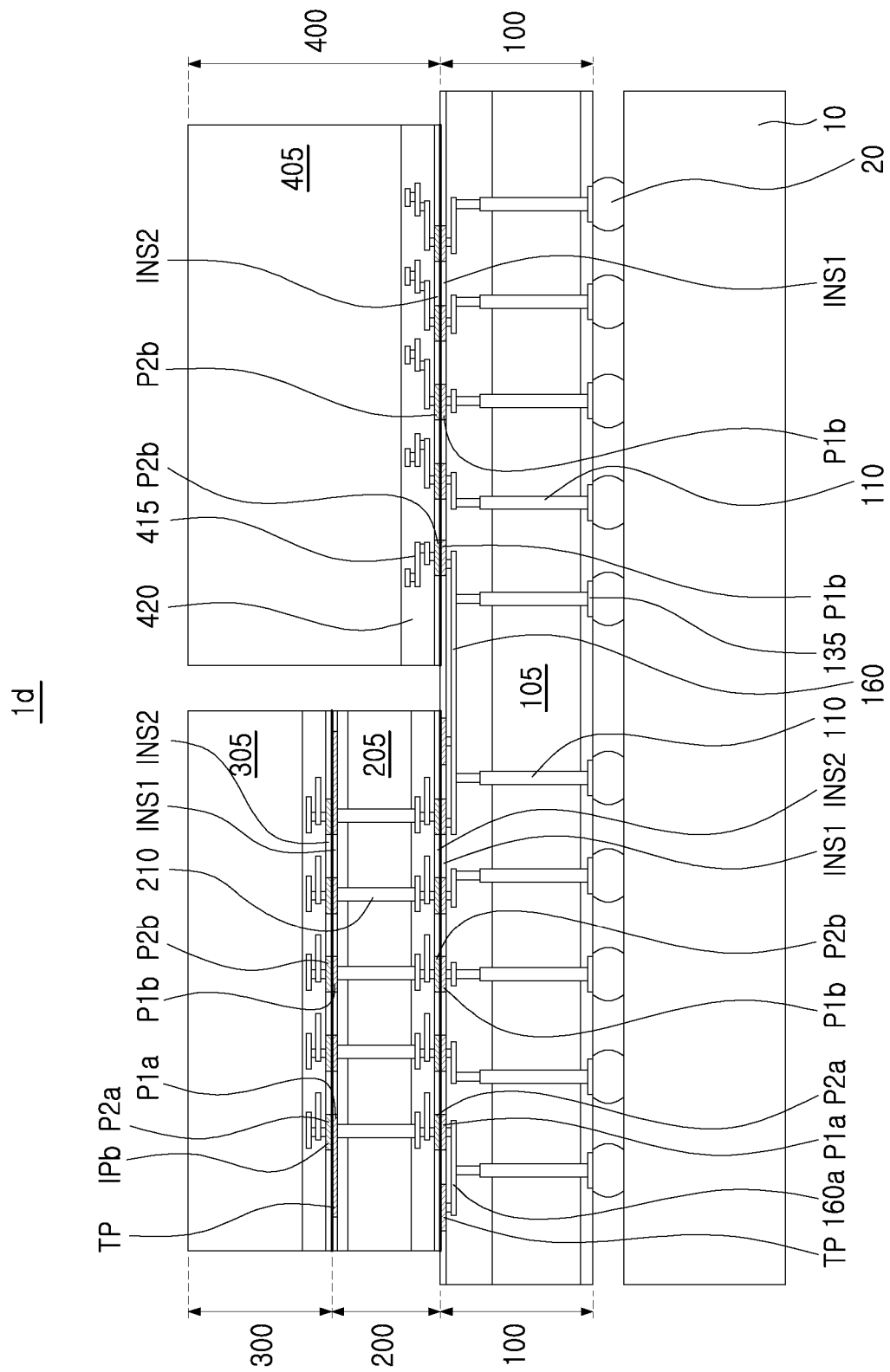
FIG. 7 is a cross-sectional view illustrating a modified example of a semiconductor package according to an example embodiment.
Figure 8:
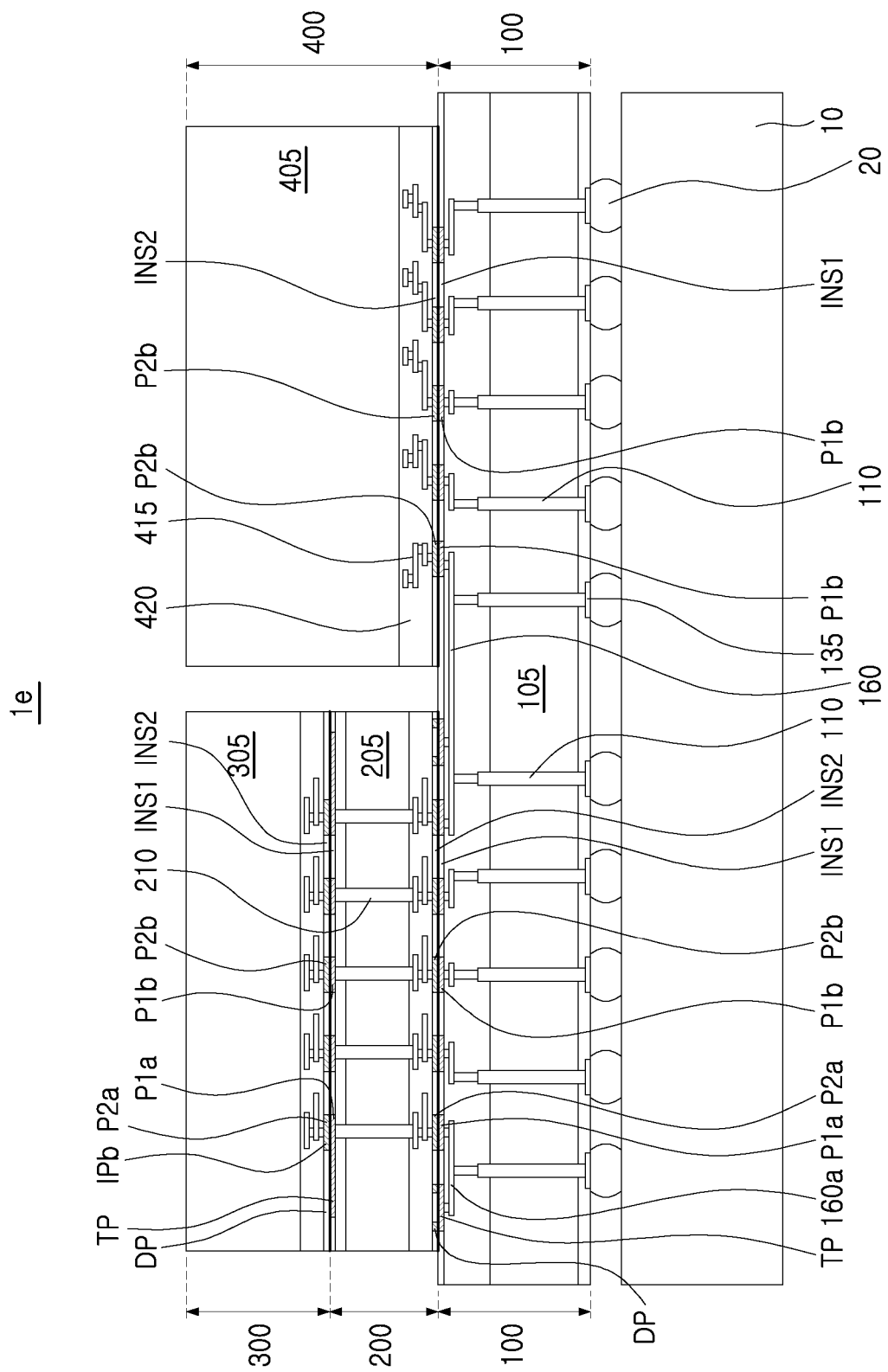
FIG. 8 is a cross-sectional view illustrating a modified example of a semiconductor package according to an example embodiment.
Figure 9:
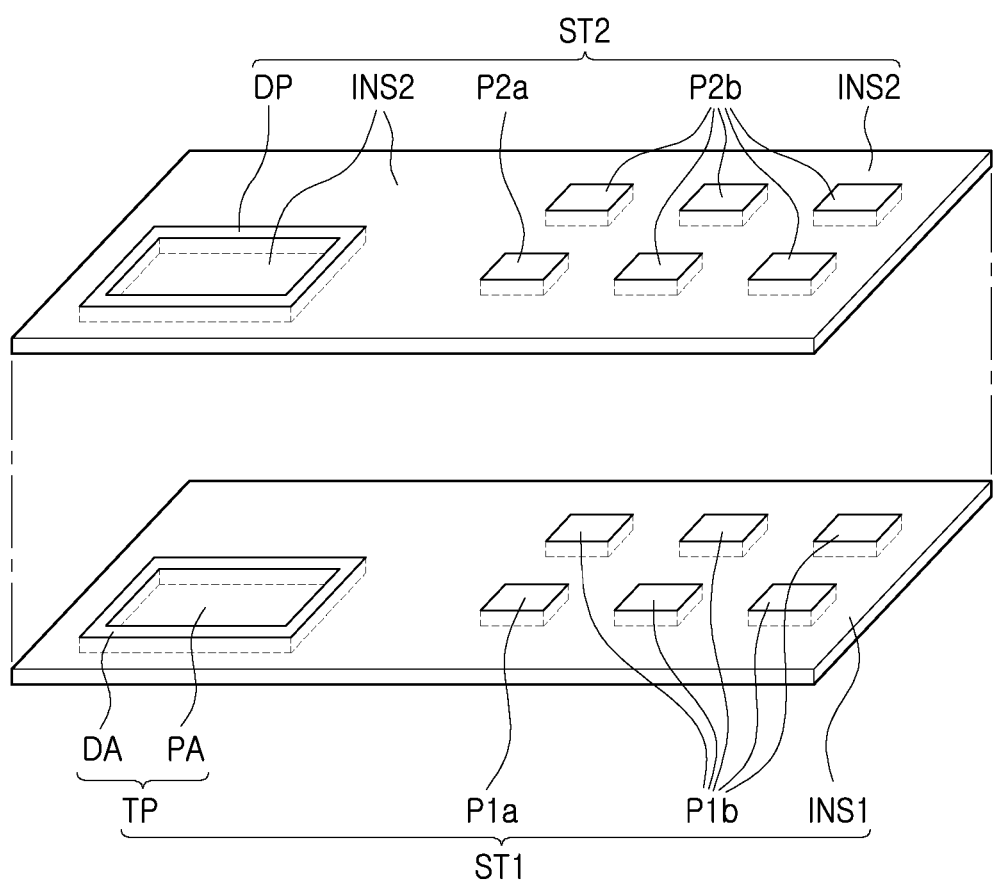
FIG. 9 is a cross-sectional view illustrating a first bonding structure and a second bonding structure of the semiconductor chip of FIG. 8 in an exploded manner according to an example embodiment.
Figure 10:
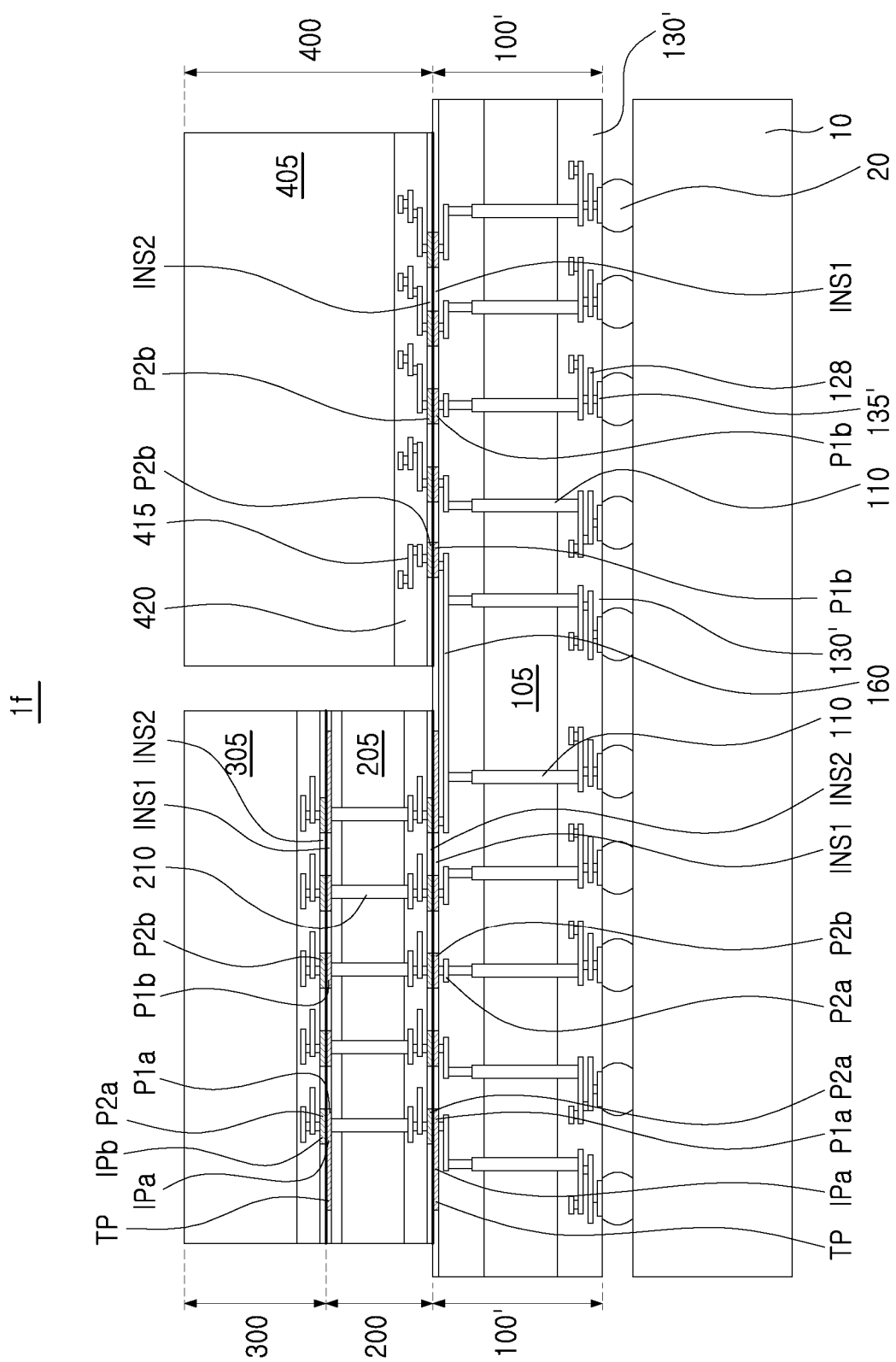
FIG. 10 is a cross-sectional view illustrating a modified example of a semiconductor package according to an example embodiment.

Next, referring to FIGS. 3 to 10, various modified examples of the semiconductor package 1b, 1c, 1d, 1e and 1f will be described. FIGS. 3 and 4 are views illustrating a modified example of a semiconductor package 1b according to an example embodiment. FIGS. 5 and 6 are views illustrating another modified example of a semiconductor package 1c according to an example embodiment. FIG. 7 is a view illustrating another modified example of a semiconductor package 1d according to an example embodiment. FIGS. 8 and 9 are views illustrating another modified example of a semiconductor package 1e according to an example embodiment, and FIG. 10 is a view illustrating another modified example of a semiconductor package 1f according to an example embodiment.

Referring to FIGS. 3 and 4, the second bonding structure ST2 may further include a dummy connection portion IPb disposed at a position corresponding to the pad connection portion IPa of the first bonding structure ST1 and being in contact with and bonded to the first bonding structure ST1. The dummy connection portion IPb may be formed of the same material as the pad connection portion IPa. The dummy connection portion IPb may extend from a portion of second pads P2a of the second pads P2a and P2b. The first semiconductor chip 200 may include the dummy connection portion IPb, in contact with and bonded to the pad connection portion IPa of the base 100, and the second semiconductor chip 300 may include the dummy connection portion IPb, in contact with and bonded to the pad connection portion IPa of the first semiconductor chip 200. Accordingly, a semiconductor package 1b further including the dummy connection portion IPb, in contact with and bonded to the pad connection portion IPa may be provided.

Figure 14A:
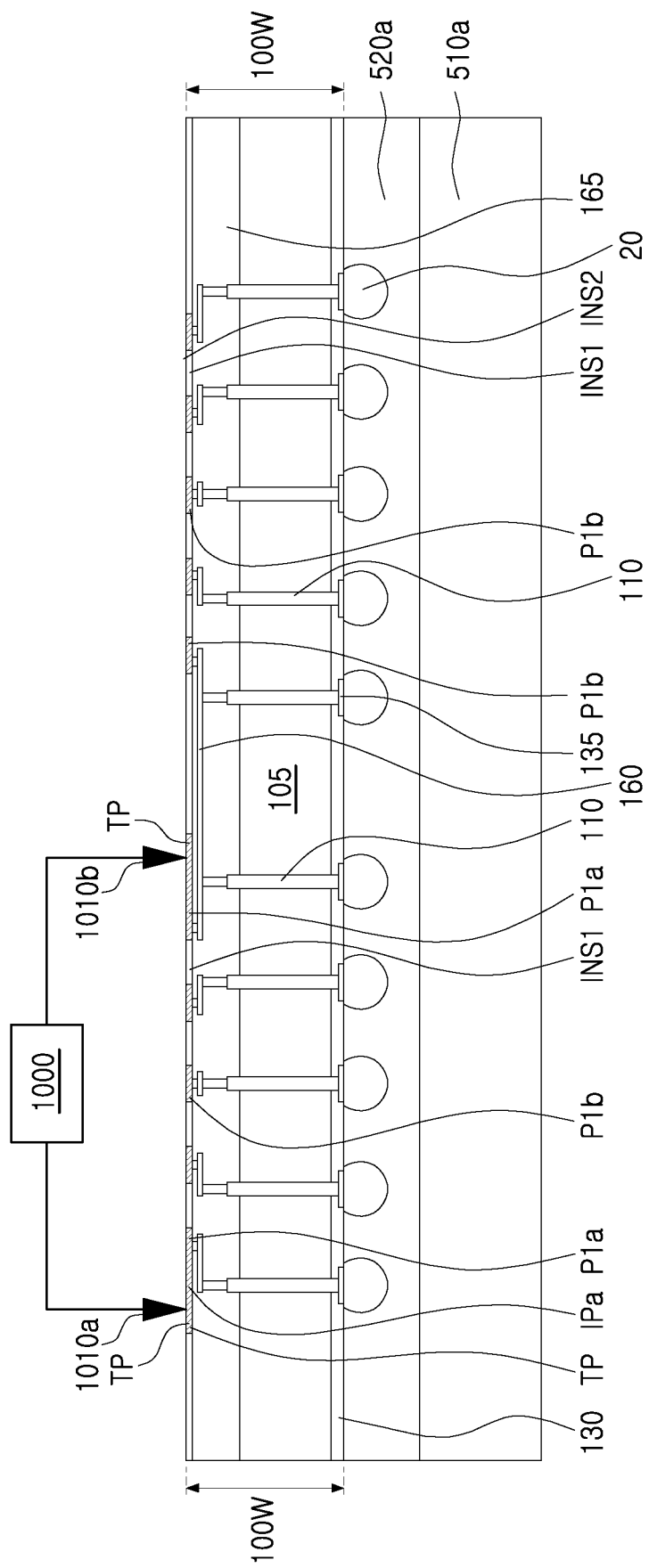
FIGS. 14A to 14D are views illustrating a method of manufacturing a semiconductor package according to an example embodiment.
Figure 14B:
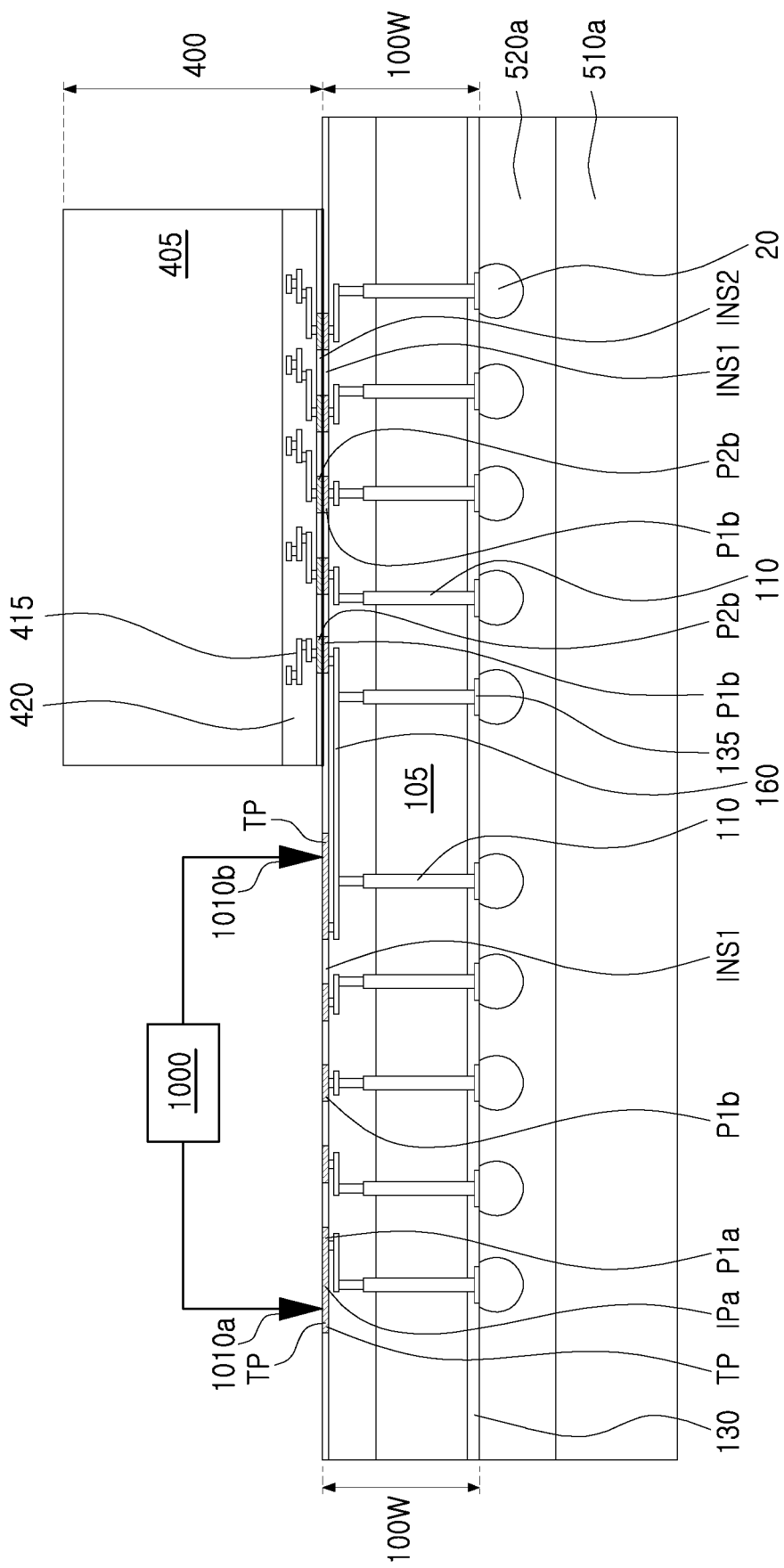
Figure 14C:
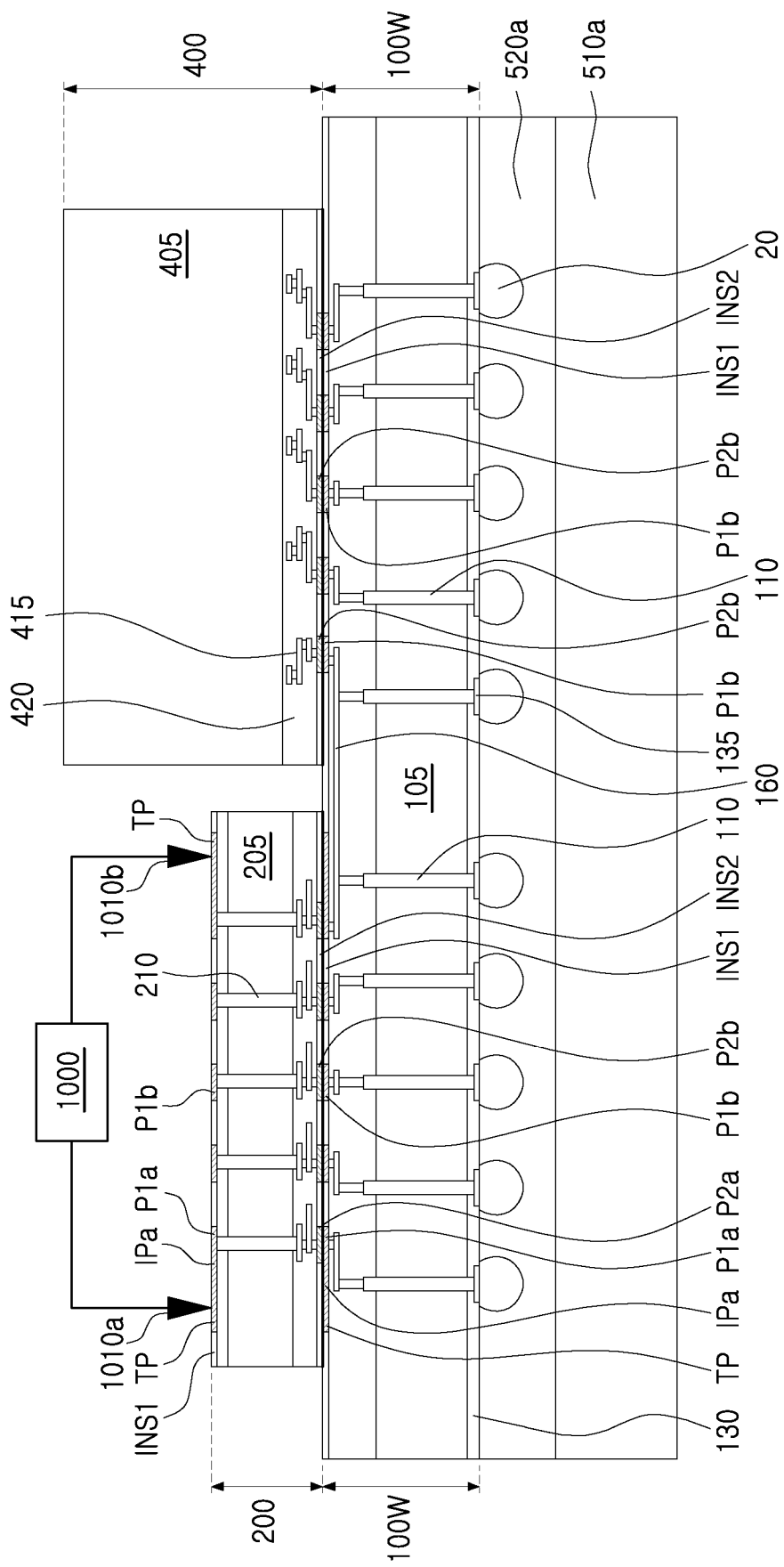

In a modified example, referring to FIGS. 5 and 6, the test pad TP of the first bonding structure ST1 may include a test area PA with which probes for inspecting defects 1010a and 1010b of FIGS. 14A, 14B and 14C are in direct contact and a dummy area DA surrounding the test area PA. The second bonding structure ST2 may be disposed in a position corresponding to the pad connection portion IPa of the first bonding structure ST1 and may further include a dummy connection portion IPb, in contact with and bonded to the pad connection portion IPa of the first bonding structure ST1 and a dummy pad area DP, in contact with and bonded to the dummy area DA of the test pad TP of the first bonding structure ST1. The test area PA may be in contact with the second insulating layer INS2 of the second bonding structure ST2.

The dummy connection portion IPb and the dummy pad area DP may formed of the same material as the pad connection portion IPa and the test pad TP. The dummy connection portion IPb may extend from a portion of second pads P2a of the second pads P2a and P2b, and the dummy pad area DP may extend from the dummy connection portion IPb.

The first semiconductor chip 200 may further include the dummy connection portion IPb, in contact with and bonded to the pad connection portion IPa of the base 100 and the dummy pad area DP, in contact with and bonded to a portion (i.e., the dummy area DA) of the test pad TP of the base 100, and the second semiconductor chip 300 may further include the dummy connection portion IPb, in contact with and bonded to the pad connection portion IPa of the first semiconductor chip 200 and the dummy pad area DP, in contact with and bonded to a portion (i.e., the dummy area DA) of the test pad TP of the first semiconductor chip 200. Accordingly, a semiconductor package 1c further including the dummy connection portion IPb and the dummy pad area DP may be provided.

In a modified example, referring to FIG. 7, in the same plane, the test pad TP of the base 100 may be spaced apart from the first pads P1a and P1b of the base 100. Some pads P1a of the first pads P1a and P1b may be electrically connected to the test pad TP of the base 100 by a lower connection structure 160a of the base wiring structure 160. The lower connection structure 160a may be disposed below the test pad TP and the first pads P1a and P1b of the base 100. Therefore, a semiconductor package 1d including the test pad TP of the base 100 and the first pads P1a and P1b of the base 100, which are spaced apart from each other in the same plane, may be provided.

In a modified example, referring to FIGS. 8 and 9, certain pads P1a of the first pads P1a and P1b of the base 100 may be electrically connected to the test pad TP by the lower connection structure 160a, as illustrated in FIG. 7. The test pad TP of the first bonding structure ST1 may include the dummy area DA and the test area PA, as described with reference to FIG. 6. The second bonding structure ST2 of each of the first and second semiconductor chips 200 and 300 may include a dummy pad area DP, spaced apart from the second pads P2a and P2b, in contact with and bonded to the dummy area DA of the test pad TP of the first bonding structure ST1. Accordingly, a semiconductor package 1e including the dummy pad area DP may be provided.

In a modified example, referring to FIG. 10, a semiconductor package 1f may include a base 100', which may be a semiconductor chip. For example, the base 100' may include a base body 105, a base internal circuit 128 disposed below the base body 105, and a base lower pad 135' disposed below the base internal circuit 128. The base internal circuit 128 may be disposed in a base lower insulating layer 130' disposed below the base body 105.

The first, second and third semiconductor chips 200, 300 and 400, as described above, may be disposed on the base 100. The base 100' and the first, second and third semiconductor chips 200, 300 and 400 may be coupled via the first and second bonding structures ST1 and ST2 as described above, which are in contact with and bonded to each other. Because the first and second bonding structures ST1 and ST2 have been described above, a detailed description thereof will be omitted here.

Figure 11:
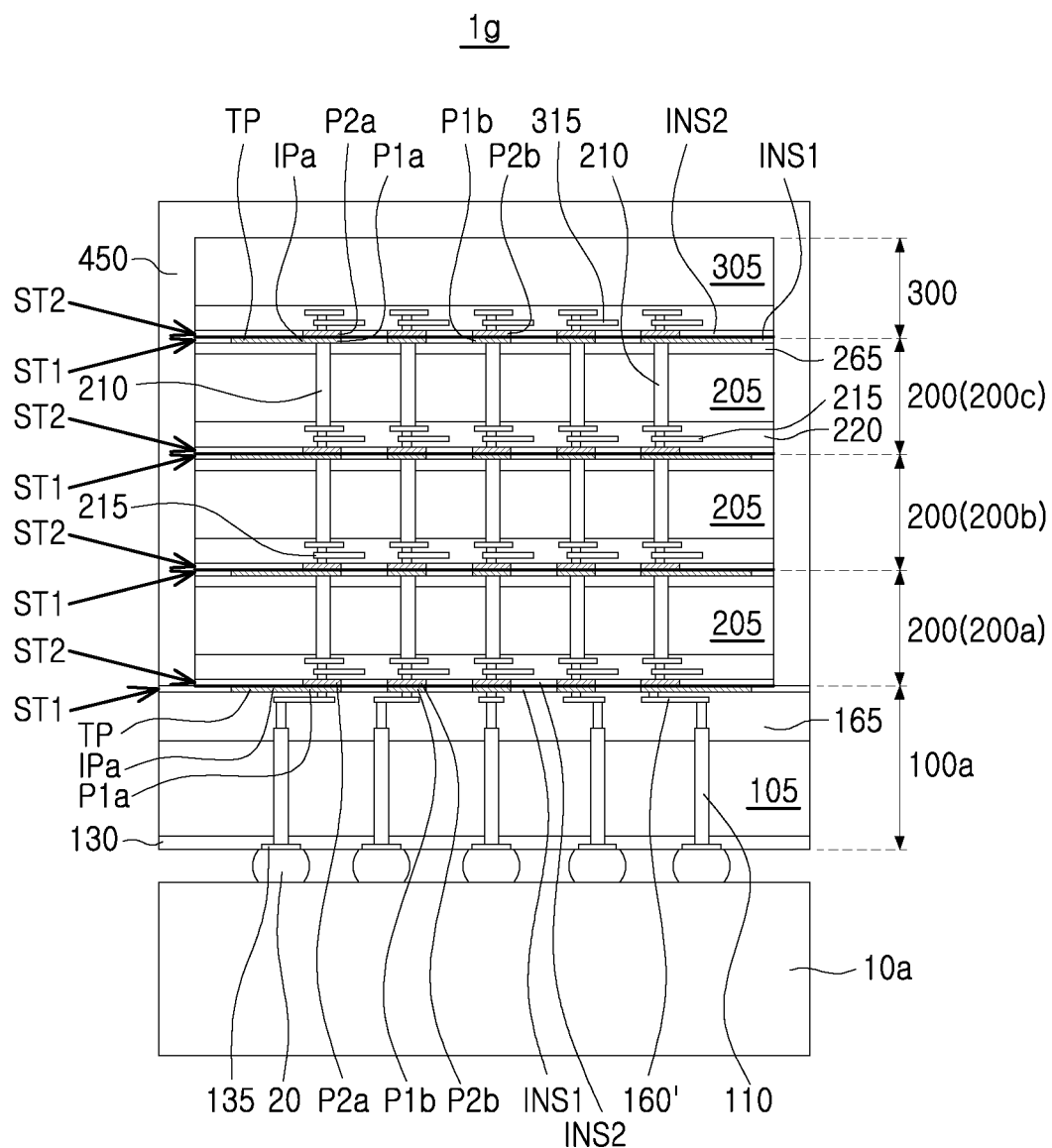
FIG. 11 is a cross-sectional view illustrating a modified example of a semiconductor package according to an example embodiment.

Next, another modified example of a semiconductor package according to an example embodiment will be described with reference to FIG. 11. FIG. 11 is a cross-sectional view illustrating a modified example of a semiconductor package 1g according to an example embodiment.

Referring to FIG. 11, a semiconductor chip 1g may include a lower structure 10a, a base 100a disposed on the lower structure 10a and a plurality of semiconductor chips 200a, 200b, 200c and 300 being stacked on the base 100a. The semiconductor package 1g may further include a molded layer 450 formed on the base 100a and surrounding the plurality of semiconductor chips 200 (200a, 200b and 200c) and 300.

The plurality of semiconductor chips 200 (200a, 200b and 200c) and 300 may include lower semiconductor chips 200 (200a, 200b and 200c), which are sequentially stacked, and an upper semiconductor chip 300 disposed on the lower semiconductor chips 200.

In an example embodiment, the lower structure 10a may be a printed circuit board or a semiconductor chip.

In an example embodiment, the base 100a may be a semiconductor chip or an interposer. The lower structure 10a and the base 100a may be electrically connected to each other via a connection structure 20 extending between the lower structure 10a and the base 100a.

Each of the lower semiconductor chips 200 (200a, 200b and 200c) may include the first bonding structure ST1 and the second bonding structure ST2, which are substantially the same as those described above.

Each of the lower semiconductor chips 200 (200a, 200b and 200c) may have the same structure as that of the first semiconductor chip 200 described in FIG. 1. Accordingly, each of the lower semiconductor chips 200 may be the first semiconductor chip 200 described in FIG. 1. For example, as the first semiconductor chip 200 is described in FIGS. 1A and 1B, each of the lower semiconductor chips 200 may include the first semiconductor body 205, the second bonding structure ST2 disposed below the first semiconductor body 205, the internal circuit structures 215 and 220 disposed between the second bonding structure ST2 and the first semiconductor body 205, the first bonding structure ST1 disposed on the first semiconductor body 205, the upper insulating layer 265 disposed between the first bonding structure ST1 and the first semiconductor body 205, and the first through electrode structure 210 penetrating through the first semiconductor body 205.

In an example embodiment, the upper semiconductor chip 300 may be the same as the second semiconductor chip 300, described in FIGS. 1A and 1B. Accordingly, the upper semiconductor chip 300 may include the second semiconductor body 305 such as the second semiconductor chip 300 described in FIGS. 1A and 1B, the internal circuit structures 315 and 320 disposed below the second semiconductor body 305, and the second bonding structure ST2 disposed below the internal circuit structures 315 and 320.

The base 100a, may include a base body 105, a lower insulating layer 130 and a base lower pad 135 disposed below the base body 105, base back side structures 160' and 165 disposed on the base body 105, the first bonding structure ST1 disposed on the base back side structures 160' and 165, and base through electrode structures 110 penetrating through the base body 105, similar to the base 100 described above in FIGS. 1A and 1B.

Because the first and second bonding structures ST1 and ST2, which are in contact with and bonded to each other have been described with reference to FIGS. 1A and 1B, the description of the first and second bonding structures ST1 and ST2 will be omitted.

Figure 12:
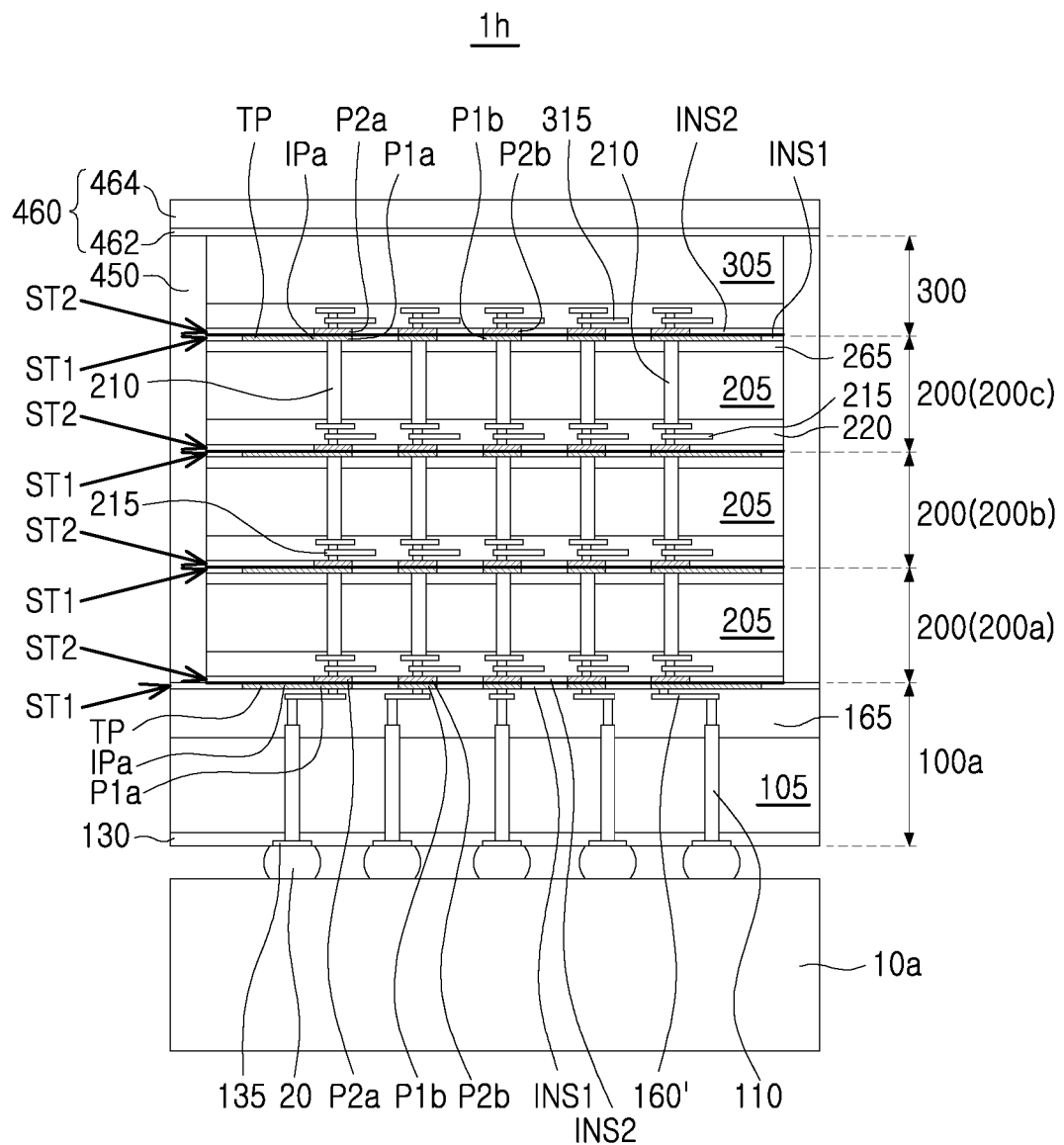
FIG. 12 is a cross-sectional view illustrating a modified example of a semiconductor package according to an example embodiment.

Next, a modified example of a semiconductor package 1h according to an example embodiment will be described with reference to FIG. 12. FIG. 12 is a cross-sectional view illustrating a modified example of a semiconductor package 1h according to an example embodiment.

In a modified example, referring to FIG. 12, the semiconductor package 1h may include the lower structure 10a as described in FIG. 11, a base 100a disposed on the lower structure 10a, and a plurality of semiconductor chips 200 (200a, 200b and 200c) and 300 stacked on the base 100a. The semiconductor package 1g may further include a molded layer 450 formed on the base 100a and surrounding side surfaces of the plurality of semiconductor chips 200 and 300.

The semiconductor package 1g may further include a heat dissipation structure 460 covering upper portions of the plurality of semiconductor chips 200 and 300. The heat dissipation structure 460 may include an insulating heat conduction layer 462 and a heat dissipation plate 464 on the heat conduction layer 462.

Figure 13:
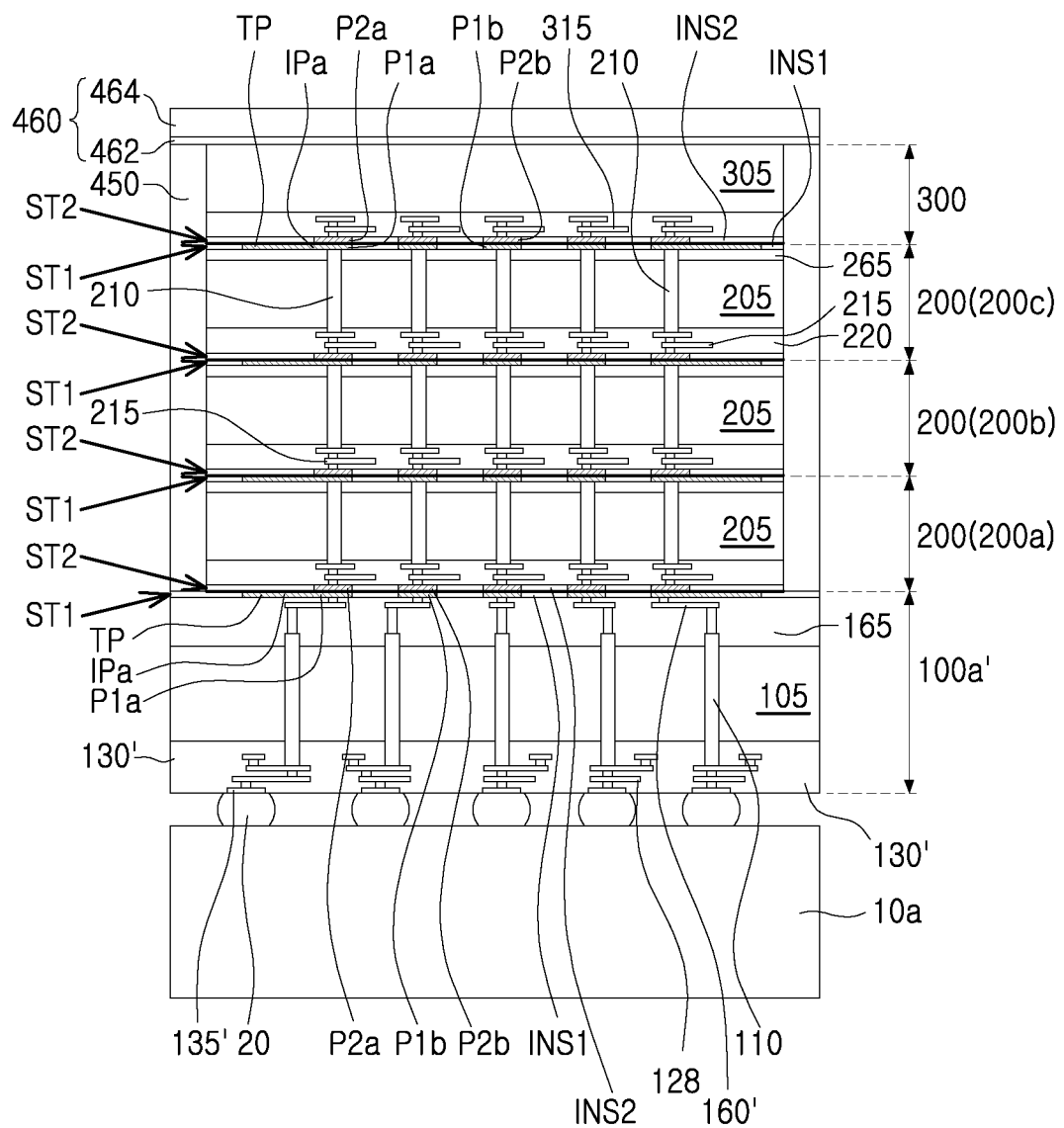
FIG. 13 is a cross-sectional view illustrating a modified example of a semiconductor package according to an example embodiment.

Next, a modified example of a semiconductor package 1i according to an example embodiment will be described with reference to FIG. 13. FIG. 13 is a cross-sectional view illustrating a modified example of a semiconductor package 1i according to an example embodiment.

In a modified example, referring to FIG. 13, the semiconductor package 1i may include a base 100a' including base internal circuit structures 130' and 135'. The base 100a' may include the base body 105, the base internal circuit 128 disposed below the base body 105', and a base lower pad 135' disposed below the base internal circuit 128, similar to the base 100' described in FIG. 10. The base internal circuit 128 may be disposed in the base lower insulating layer 130' below the base body 105.

The base 100a' may include the base back side structures 160' and 165 disposed on the base body 105, the first bonding structure ST1 disposed on the base back side structures 160' and 165 and the base through electrode structure 110 penetrating through the base body 105, as described above. Accordingly, the base 100a' may be a semiconductor chip including the base internal circuit 128.

The semiconductor package 1i may be understood as a structure similar to the semiconductor packages 1g and 1h with reference to FIGS. 11 and 12, except for the base 100a described in FIGS. 11 and 12.

Next, an example embodiment of a method of manufacturing a semiconductor package according to an example embodiment will be described with reference to FIGS. 14A to 14D.

Referring to FIG. 14A, a wafer 100W may be attached to a carrier substrate 510a. The wafer 100W may be attached to the carrier substrate 510a by an adhesive layer 520a disposed on the carrier substrate 510a.

The wafer 100W may include a base body 105, a lower insulating layer 130 and a base lower pad 135 disposed below the base body 105, base back side structures 165 and 160 on the base body 105, a first bonding structure on the base back side structures 160 and 165 and base through electrode structures 110 penetrating through the base body 105. The base back side structures 160 and 165 may include a base back side wiring structure 160 disposed in the base back side insulating layer 165. The base body 105 may be a semiconductor wafer, for example, a silicon wafer. That is, the base body 105 may be a semiconductor substrate, for example, a silicon substrate.

The first bonding structure may include first pads P1a and P1b, pad connection portions IP, test pads TP, and a first insulating layer INS1, as described with reference to FIGS. 1A and 1B. As the first pads P1a and P1b, the pad connection portions IP, the test pads TP, and the first insulating layer INS1 have been described with reference to FIGS. 1A and 1B, a detailed description thereof will be omitted here.

A connection structure 20 may be formed below the base lower pad 135 of the wafer 100W. The connection structure 20 may be embedded in the adhesive layer 520a.

Defects of the wafer 100W may be inspected using a test apparatus 1000. For example, by contacting probes 1010a and 1010b of the test apparatus 1000 with different test pads TP, the wafer 100W may be inspected by measuring an electrical short of the base wiring structure 160 or a leakage current of the base wiring structure 160.

Referring to FIG. 14B, as described above, when the wafer 100W is determined to perform in a normal state (i.e., without any defect) as a result of inspecting defects of the wafer 100W, a semiconductor chip 400 may be coupled to a portion of the wafer 100W. The semiconductor chip 400 may be the third semiconductor chip 400 described with reference to FIGS. 1A and 1B. Accordingly, the third semiconductor chip 400 may include the third semiconductor body 405, internal circuit structures 415 and 420 disposed below the third semiconductor body 405, and the second pads P2b disposed below the internal circuit structures 415 and 420 and the second insulating layer INS2. The internal circuit structures 415 and 420 may include a lower insulating layer 420 and internal circuit wirings 415 disposed in the lower insulating layer 420.

The third semiconductor chip 400 may be placed on the wafer 100W and a pressure may be applied to the third semiconductor chip 400 in a thermal atmosphere higher than a room temperature, for example, about 200° C. to about 300° C. Thus, the first pads P1b of the wafer 100W and the second pads P2b of the third semiconductor chip 400 may be bonded and coupled to each other, and the first insulating layer INS1 of the wafer W and the second insulating layer INS2 of the third semiconductor chip 400 may be bonded and coupled to each other. Here, the temperature of the thermal atmosphere may be not limited to about 200° C. to about 300° C., and may be varied according to design intent. When the connection structure 20 embedded in the adhesive layer 520a is a solder ball, the adhesive layer 520a may prevent the connection structure 20 from being deformed by the thermal atmosphere.

The defect of the third semiconductor chip 400 may be inspected using the test apparatus 1000 in the same manner as described above in reference to FIG. 14A. For example, by contacting the probes 1010a and 1010b of the test apparatus 1000 with different test pads TP of the wafer 100W, the electrical short or leakage current of the internal circuit wirings of the third semiconductor chip 400 may be measured such that the third semiconductor chip 400 may be inspected.

Referring to FIG. 14C, when the third semiconductor chip 400 is functioning in a normal state as a result of inspecting defects of the third semiconductor chip 400, the first semiconductor chip 200, as described in FIGS. 1A and 1B, may be coupled to the wafer 100W thereafter.

The first semiconductor chip 200 may include the first bonding structure (ST1 of FIG. 1B) and the second bonding structure (ST2 of FIG. 1B), such as those described in FIGS. 1A and 1B. The first bonding structure ST1 of FIG. 1B of the first semiconductor chip 200 may be bonded while being in contact with the wafer 100W. The second bonding structure (ST2 of FIG. 1B) of the first semiconductor chip 200 may include the second pads P2a and P2b and the second insulating layer INS2, as described with reference to FIGS. 1A, 1B, 2A and 2B. The first bonding structure (ST1 of FIG. 1B) of the first semiconductor chip 200 may include the first pads P1a and P1b, the test pads TP, and the first insulating layer INS1, as described with reference to FIGS. 1A, 1B, 2A and 2B.

The first semiconductor chip 200 may be placed on the wafer 100W, and a pressure may be applied to the first semiconductor chip 200 in a thermal atmosphere at a temperature higher than a room temperature. Thus, the first pads P1a and P1b of the wafer 100W and the second pads P2a and P2b of the first semiconductor chip 200 may be bonded and coupled to each other and the first insulating layer INS1 of the wafer 100W and the second insulating layer INS2 of the first semiconductor chip 200 may be bonded and coupled to each other. Here, the temperature of the thermal atmosphere may be not limited to about 200° C. to about 300° C., and may be variously changed. When the connection structure 20 embedded in the adhesive layer 520a is a solder ball, the adhesive layer 520a may prevent the connection structure 20 from being deformed by the thermal atmosphere.

Then, the defect of the first semiconductor chip 200 may be inspected using the test apparatus 1000 in the same manner as described above. For example, by contacting the probes 1010a and 1010b of the test apparatus 1000 with the test pads TP of the first semiconductor chip 200, the electrical short of leakage current of the internal circuit wirings (215 of FIG. 1B) of the first semiconductor chip 200 may be measured such that the first semiconductor chip 200 may be inspected.

Figure 14D:
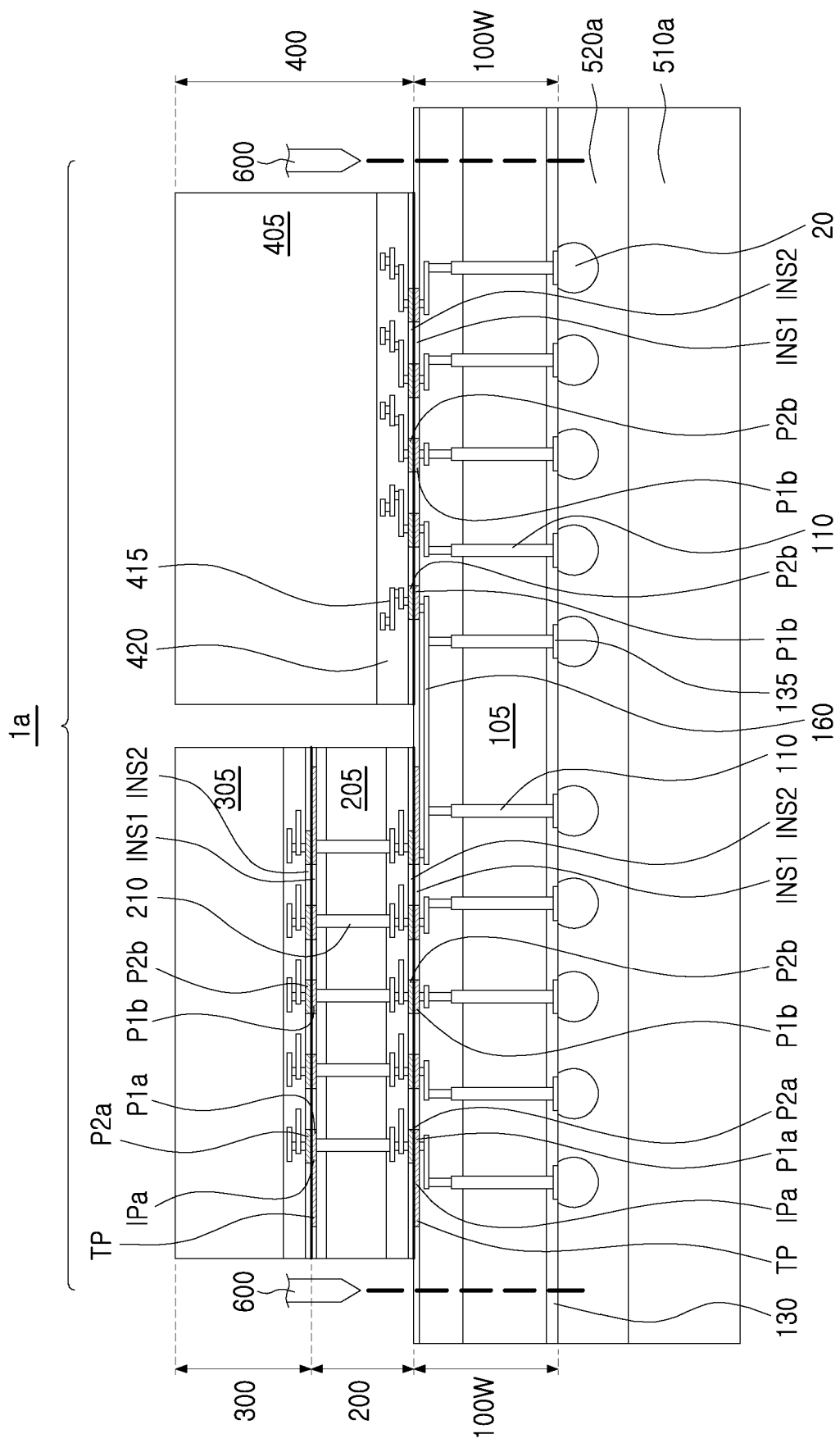

Referring to FIG. 14D, when the first semiconductor chip 200 is functioning in a normal state as a result of inspecting defects of the first semiconductor chip 200, the second semiconductor chip 300, as described in FIGS. 1A and 1B, may be coupled to the first semiconductor chip 200. The coupling of the second semiconductor chip 300 to the first semiconductor chip 200 may be substantially the same as coupling the first semiconductor chip 200 to the wafer 100W.

Then, the wafer 100W may be cut via a sawing process 600 to cut the wafer 100W, and then the cut wafer 100W may be separated from the adhesive layer 520a. Accordingly, a semiconductor package 1a may be formed as described in FIGS. 1A and 1B. When the semiconductor package 1a further includes the lower structure 10 as described in FIGS. 1A and 1B, it may further include that after separating the cut wafer 100W from the adhesive layer 520a, the separated wafer W may be mounted on the lower structure 10.

In another example, to form a semiconductor package 1g described in FIG. 11, defect inspection for the wafer 100W as illustrated in FIG. 14A may be performed, and then the formation of the first semiconductor chip 200 and the defect inspection of the first semiconductor chip 200 may be repeatedly performed as illustrated in FIG. 14C, and then the second semiconductor chip 300 as described in FIG. 14D may be formed. Then, a molded layer (450 of FIG. 11) as described in FIG. 11 may be formed, and a sawing process 600 cutting the molded layer (450 of FIG. 11) and the wafer 100W may be performed.

According to example embodiments, a semiconductor package including the first pads P1a and P1b of the first bonding structure ST1 and the second pads P2a and P2a of the second bonding structure ST2 which are in contact and bonded to each other and the first insulating layer INS1 of the first bonding structure ST1 and the second insulating layer INS2 of the second bonding structure ST2 which are in contact and bonded to each other may be provided. The thickness of the semiconductor package may be miniaturized. Such a semiconductor package may more efficiently discharge the heat in the chips externally through the first pads P1a and P1b and the second pads P2a and P2a, which are in contact and coupled to each other. A semiconductor package with improved heat generation characteristics may be provided.

According to example embodiments, a semiconductor package including the test pad TP may be provided. Before final formation of the semiconductor package, because it is possible to check whether or not the chip in the semiconductor package is defective through the test pad TP, such that the productivity of the semiconductor package may be improved.

As set forth above, according to an example embodiment, a semiconductor package including pads bonded to each other while being in contact with each other and chips including insulating layers coupled to each other while being in contact with each other may be provided. The thickness of the semiconductor package may be reduced, such that the semiconductor package may be miniaturized. Such a semiconductor package may efficiently discharge heat in the chips externally through pads coupled to each other while being in contact with each other. Therefore, a semiconductor package with improved heat dissipation characteristics may be provided.

According to example embodiments, a semiconductor package including a test pad may be provided. Because it is possible to inspect whether or not the semiconductor chip is defective in the semiconductor package through the test pad, before final formation of the semiconductor package, the productivity of the semiconductor package may be improved.

While example embodiments have been shown and described above, it will be apparent to those skilled in the art that modifications and variations could be made without departing from the scope of the present inventive concept as defined by the appended claims.

What is claimed is:

1. A semiconductor package comprising:
a base including a first bonding structure; and
a first semiconductor chip, including a second bonding structure, the second bonding structure being coupled to the first bonding structure of the base,
wherein the first bonding structure includes:
a test pad;
a first pad being electrically connected to the test pad; and
a first insulating layer,
wherein the second bonding structure includes:
a second pad being electrically connected to the first pad; and
a second insulating layer being in contact with the first insulating layer and at least a portion of the test pad,
wherein at least a portion of an upper surface of the test pad is in contact with a lower surface of the second insulating layer,
wherein the first bonding structure further includes a pad connection portion electrically connecting the first pad and the test pad to each other, and
wherein the second bonding structure further includes a dummy connection portion, the dummy connection portion being in contact with the pad connection portion.

2. The semiconductor package of claim 1, wherein at least a portion of the pad connection portion is in contact with the second insulating layer.

3. The semiconductor package of claim 1, wherein the base includes:
a base body;
a through electrode structure penetrating through the base body; and
a base back side structure disposed on the base body,
wherein the first bonding structure of the base is disposed on the base back side structure, and
wherein the base back side structure includes a base wiring structure electrically connected to the test pad.

4. The semiconductor package of claim 3, wherein the base body comprises a silicon substrate.

5. The semiconductor package of claim 1, wherein the base comprises an interposer.

6. The semiconductor package of claim 1, wherein the base comprises a semiconductor chip.

7. The semiconductor package of claim 1, wherein the test pad has a width greater than a width of the first pad.

8. The semiconductor package of claim 1 further comprising:
a lower structure disposed below the base; and
a connection structure disposed between the base and the lower structure.

9. The semiconductor package of claim 1,
wherein the first semiconductor chip further includes:
a semiconductor body;
an internal circuit wiring under the lower semiconductor body; and
a through electrode structure penetrating through the semiconductor body and electrically connected to the internal circuit wiring and the first pad, and
wherein the semiconductor body is between the internal circuit wiring and the second bonding structure.

10. A semiconductor package comprising:
a base including a first bonding structure; and
a first semiconductor chip, including a second bonding structure, the second bonding structure being coupled to the first bonding structure of the base,
wherein the first bonding structure includes:
a test pad;
a first pad being electrically connected to the test pad; and
a first insulating layer,
wherein the second bonding structure includes:
a second pad being electrically connected to the first pad; and
a second insulating layer being in contact with the first insulating layer and at least a portion of the test pad, wherein at least a portion of an upper surface of the test pad is in contact with a lower surface of the second insulating layer, wherein the first bonding structure further includes a pad connection portion electrically connecting the first pad and the test pad to each other, wherein the second bonding structure further includes a dummy pad portion, wherein the test pad of the base includes:
   a test area; and
   a dummy area surrounding the test area, and wherein the dummy pad portion of the second bonding structure is in contact with the dummy area of the test pad.

11. The semiconductor package of claim 10, wherein the test area is in contact with the second insulating layer of the first semiconductor chip.

\* \* \* \* \*